(12) United States Patent
Rana et al.

(10) Patent No.: US 8,512,587 B2
(45) Date of Patent: Aug. 20, 2013

(54) HIGHLY SELECTIVE DOPED OXIDE ETCHANT

(75) Inventors: Niraj Rana, Boise, ID (US); Prashant Raghu, Boise, ID (US); Kevin Torek, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 834 days.

(21) Appl. No.: 11/830,059

(22) Filed: Jul. 30, 2007

(65) Prior Publication Data

US 2007/0262048 A1    Nov. 15, 2007

Related U.S. Application Data

(62) Division of application No. 11/360,540, filed on Feb. 23, 2006.

(51) Int. Cl.
*B44C 1/22* (2006.01)
*H01L 21/302* (2006.01)
*C03C 15/00* (2006.01)

(52) U.S. Cl.
USPC .......... 216/83; 216/95; 216/96; 216/99; 438/745; 438/754; 438/756; 252/79.2; 252/79.3

(58) Field of Classification Search
USPC .......... 216/83; 438/745; 252/79.2, 79.3
See application file for complete search history.

(56) References Cited

U.S. PATENT DOCUMENTS

| | | | |
|---|---|---|---|
| 4,395,304 A * | 7/1983 | Kern et al. | 438/756 |
| 4,681,657 A * | 7/1987 | Hwang et al. | 438/753 |
| 4,721,548 A | 1/1988 | Morimoto | |
| 5,124,274 A | 6/1992 | Ohki et al. | |
| 5,300,463 A | 4/1994 | Cathey | |
| 5,344,524 A | 9/1994 | Sharma et al. | |
| 5,824,601 A * | 10/1998 | Dao et al. | 438/713 |
| 5,906,708 A | 5/1999 | Robinson et al. | |
| 6,156,968 A | 12/2000 | Nishimoto et al. | |
| 6,162,739 A | 12/2000 | Sumnitsch et al. | |
| 6,235,145 B1 | 5/2001 | Li et al. | |
| 6,280,651 B1 * | 8/2001 | Wojtczak et al. | 252/79.1 |
| 6,437,417 B1 | 8/2002 | Gilton | |
| 6,465,828 B2 | 10/2002 | Agarwal | |

(Continued)

FOREIGN PATENT DOCUMENTS

DE    1942544 A1    3/1971
EP    1150342 A1    10/2001

(Continued)

OTHER PUBLICATIONS

Transactions of the American Electrochemical Society. American Electorchemical Society: 1912, pg. 150 dielectric constant of propionic acid.*

(Continued)

*Primary Examiner* — Shamim Ahmed
(74) *Attorney, Agent, or Firm* — TraskBritt

(57) ABSTRACT

Etch solutions for selectively etching doped oxide materials in the presence of silicon nitride, titanium nitride, and silicon materials, and methods utilizing the etch solutions, for example, in construction of container capacitor constructions are provided. The etch solutions are formulated as a mixture of hydrofluoric acid and an organic acid having a dielectric constant less than water, optionally, with an inorganic acid, and a pH of 1 or less.

36 Claims, 18 Drawing Sheets

(56) References Cited

U.S. PATENT DOCUMENTS

| | | | |
|---|---|---|---|
| 6,583,055 B1* | 6/2003 | Chu | 438/638 |
| 6,589,884 B1 | 7/2003 | Torek | |
| 6,783,695 B1 | 8/2004 | Torek et al. | |
| 7,052,627 B1* | 5/2006 | Kezuka et al. | 252/79.1 |
| 2001/0037995 A1 | 11/2001 | Akatsu et al. | |
| 2002/0024119 A1* | 2/2002 | Tanaka et al. | 257/649 |
| 2002/0082171 A1 | 6/2002 | Schoop et al. | |
| 2002/0145199 A1* | 10/2002 | Nakamura et al. | 257/752 |
| 2003/0017686 A1 | 1/2003 | Wada | |
| 2003/0029839 A1 | 2/2003 | Chou | |
| 2003/0041526 A1* | 3/2003 | Fujii et al. | 51/307 |
| 2003/0157802 A1 | 8/2003 | Lai | |
| 2003/0222241 A1 | 12/2003 | Torek et al. | |
| 2004/0033684 A1 | 2/2004 | Li | |
| 2004/0094793 A1* | 5/2004 | Noguchi et al. | 257/315 |
| 2004/0149477 A1 | 8/2004 | Zhuang et al. | |
| 2004/0169259 A1 | 9/2004 | Zheng et al. | |
| 2005/0014391 A1 | 1/2005 | Shioya et al. | |
| 2005/0029563 A1 | 2/2005 | Zhuang et al. | |
| 2005/0142943 A1 | 6/2005 | Van Lydegraf | |
| 2005/0158949 A1* | 7/2005 | Manning | 438/253 |
| 2005/0191805 A1 | 9/2005 | Torek et al. | |
| 2005/0191856 A1 | 9/2005 | Torek et al. | |
| 2005/0224459 A1 | 10/2005 | Kezuka et al. | |
| 2005/0250339 A1 | 11/2005 | Shea et al. | |
| 2005/0255712 A1* | 11/2005 | Kato et al. | 438/791 |
| 2005/0287749 A1 | 12/2005 | Li | |
| 2005/0287780 A1 | 12/2005 | Manning et al. | |
| 2005/0287795 A1 | 12/2005 | Torek et al. | |
| 2006/0014344 A1 | 1/2006 | Manning | |
| 2006/0035797 A1 | 2/2006 | Tomita et al. | |
| 2007/0049041 A1* | 3/2007 | Rana | 438/736 |

FOREIGN PATENT DOCUMENTS

| | | | |
|---|---|---|---|
| WO | 99/33094 A1 | | 7/1999 |
| WO | WO 2005/062349 | * | 7/2005 |
| WO | 2006124201 A2 | | 11/2006 |

OTHER PUBLICATIONS

Smith, W.D., Metallography USA, 4(1971) 371-373.

pKa Table retrieved from http://clas.sa.ucsb.edu/staff/Resource%20folder/Chem109ABC/Acid,%20Base%20Strength/Table%20of%20Acids%20w%20Kas%20and%20pKas.pdf on Mar. 12, 2013.

* cited by examiner

HIGHLY SELECTIVE DOPED OXIDE ETCHANT

CROSS-REFERENCE TO RELATED APPLICATION

This application is a divisional of U.S. patent application Ser. No. 11/360,540, filed Feb. 23, 2006.

FIELD OF THE INVENTION

The invention relates generally to semiconductor and microelectromechanical systems (MEMS) processing methods and constructions, and more particularly to methods of forming capacitor structures in memory devices.

BACKGROUND OF THE INVENTION

A dynamic random access memory (DRAM) device is commonly used in electronic systems to store data. A typical DRAM device will have one region corresponding to a memory array and another region peripheral to the memory array in which logic or other circuitry is to be formed. Each memory cell generally consisting of a capacitor coupled through a transistor gate electrode or wordline stack to a bit or digit line.

Continuing advances in miniaturization and densification of integrated circuits have led to smaller areas available for devices such as transistors and capacitors. With shrinkage of the cell size, maintaining a sufficient amount of cell charge storage capacitance is a challenge in a DRAM construction.

Several techniques have been developed to increase the storage capacity of a capacitor in a limited space. One such technique is to fabricate a double-sided container capacitor, which involves forming a cup-shaped bottom electrode in an opening formed in a sacrificial insulative layer, which is typically a doped oxide layer such as phosphosilicate glass (PSG), borophosphosilicate glass (BPSG), or borosilicate glass (BSG), for example. The doped oxide layer is etched back to expose the exterior surface of the bottom electrode, and a dielectric material and then a top electrode layer are deposited to form the container capacitor structure. Using a double-sided bottom electrode provides a higher surface area for increased capacitance.

A draw-back of the foregoing process is that exposure of both the interior and exterior surfaces of a "ee-standing" container, particular a container having a high aspect ratio, can render the container structurally weak and subject to collapse during exposure to a wet-etch process to remove the doped oxide material from adjacent the bottom electrode. To overcome that problem, a silicon nitride (SiN) lattice is formed over the structure to support and hold adjacent capacitor containers together.

Steps in a prior art method of forming a double-sided container capacitor utilizing a SiN lattice are illustrated with reference to FIGS. 1-6.

FIG. 1, which depicts a wafer fragment 10 at a preliminary processing step, includes a substrate 12 with active areas 14. A relatively thick layer of a doped oxide insulative layer 16 (e.g., PSG) has been formed over the substrate 12, having an exemplary thickness of about 14,000-18,000 Å. The substrate 12 is divided into three defined regions (indicated by dashed lines), including a memory cell array region 18, a peripheral logic circuitry (peripheral) area 20 where control circuitry (i.e., logic circuitry, etc.) associated with the control of data flow to and from memory devices associated with the memory cell array is formed, and intermediate region 22 corresponding to an area between the memory cell array region 18 and the peripheral area 20.

In a first step depicted in FIGS. 1 and 1A, a blanket layer of silicon nitride (SiN) 24, which is typically about 1,200-1,400 Å thick, is deposited over the doped oxide insulative layer 16, and the SiN layer 24 and doped oxide layer 16 over the memory array region 18 are etched to form openings (capacitor containers) 26, for example, by successive standard dry etch processes, through openings in patterned photoresist masks. A trench 28, which can be etched simultaneously with the capacitor containers 26, is also formed within the intermediate region 22 between the memory cell array region 18 and the peripheral area 20. The resulting structure, depicted in FIGS. 2 and 2A, provides a SiN lattice portion 30, which functions as a retaining structure to support adjacent capacitor containers 26.

Conventionally, the SiN layer 24 is formed using a high temperature deposition process at about 700° C. to 780° C. However, high process temperatures can be detrimental, and the trend for future generation devices is the use of low temperature depositions of about 600° C. or less due to thermal budget limitations and to avoid damaging existing features. One such process is an LPCVD process using hexachlorodisilane (HCD, $Si_2Cl_6$) at a low temperature (about 600° C. or less) to deposit HCD silicon nitride as the SiN layer 24.

An electrically conductive layer 32 is then formed within the container openings 26 and the trench 28, as shown in FIGS. 3 and 3A. Generally, the thickness of the conductive layer 32 is about 200-400 Å. The conductive layer 32 can comprise, for example, conductively doped silicon, metal, and metal-containing compounds, which in the present example, is titanium nitride (TiN). The TiN layer 32 within the container openings 26 ultimately forms the lower electrode of the container capacitor structure. The container constructions can be considered to comprise an inner surface 34 within the container openings 26 and an exterior or outer surface 36 laterally opposed to the inner surface 34.

Referring to FIGS. 4 and 4A, the TiN layer 32 is then removed from over the surface of the structure to expose the SiN layer 24 (including the SiN lattice portion 30) and to electrically isolate the TiN layer 32 within the container openings 26 from one another, for example, by chemical-mechanical polishing, thus forming the bottom electrodes of the container capacitor structures.

After removal of the TiN layer 32 from outside the openings 26, a photoresist mask layer 38 is blanket coated over the memory cell array region 18, peripheral region 20, and intermediate area 22 into the openings 26 and the trench 28. As illustrated in FIGS. 5 and 5A, the photoresist mask layer 38 is patterned over the memory cell area region 18 to expose bands of the SiN lattice portion 30 between adjacent pairs of container openings 26. Portions of the TiN layer 32 (bottom electrodes) in the openings 26 and trench 28 are shown in phantom to indicate that the masking layer covers such portions.

A pattern is transferred from the photoresist mask layer 38 to the SiN layer 24, and the photoresist mask layer 38 is removed. A conventional dry etch can then be performed to selectively remove unmasked portions of the SiN lattice portion 30 and expose the underlying doped oxide insulative layer 16 of between pairs of capacitor container rows, with the remaining portions of the SiN lattice portion 30 interconnecting and holding adjacent pairs of capacitor containers 26 together, resulting in the structure shown in FIGS. 6 and 6A.

Next, the doped oxide layer 16 in the memory cell array region 18 is isotropically wet etched selectively relative to the SiN lattice portion 30 and the TiN layer 32 within the openings 26 to expose all or part of the outer surfaces 36 of the TiN bottom electrode 32. Since it is not desirable to remove the doped oxide layer 16 within the peripheral area 20, the SiN layer 24 is maintained over that area. The TiN layer 32 within the trench 28 together with the SiN layer 24 over the peripheral area 20 function together as a barrier to prevent wet etch solutions from seeping into the doped oxide layer 16 within the peripheral area 20 during the etching of the doped oxide layer 16 within the memory cell array region 18, which could damage circuitry (not shown) associated with the peripheral area 20.

In etching the doped oxide layer 16, which is very thick compared to the thin SiN layer 24, the SiN layer (including the SiN lattice portion 30) will be etched by the time that the thickness of the doped oxide insulative layer 16 is removed if the selectivity of the etch solution for the doped oxide material is not extremely high. Current processes for selectively etching doped oxides (e.g., PSG) relative to silicon nitride utilize wet etchants.

One such etchant is a mixture of acetic acid ("ac") and hydrofluoric acid (HF, 49% by wt.), typically in a 30:1 (v/v) ac:HF ratio, which provides a selective etch of PSG relative to silicon nitride of about 250:1-400:1. However, the etch rate is relatively slow at about 2,000 Å/minute, which impacts processing throughput.

Another conventional etchant for selectively etching a doped oxide is a 10:1 (v/v) ratio of water (deionized water, DI) and HF (49% by wt.). Although a 10:1 DI:HF etchant solution provides an etch rate of about 9,000 Å/minute, the selectivity for a doped oxide relative to silicon nitride is only about 200:1 for high temperature nitrides such as DCS (dichlorosilane) silicon nitride, and only about 50-55:1, at best for low temperature silicon nitrides such as HCD silicon nitride. Thus, current $H_2O$:HF etch chemistries for high temperature silicon nitrides do not provide the selectivity of doped oxide relative to low temperature silicon nitrides that is needed in the fabrication of container constructions.

Consequently, etching away a relatively thick, doped oxide layer (e.g., PSG) to expose the bottom electrode wall requires an etchant with a high selectivity to relative to silicon nitride and other materials such as the bottom electrode material (e.g., TiN) and polysilicon, which form portions of the capacitor structure.

SUMMARY OF THE INVENTION

The present invention is directed to etch solutions formulated for selectively etching doped oxide materials relative to silicon nitride, titanium nitride, and silicon materials, and methods utilizing the etch solutions, for example, in the construction of container capacitor constructions.

In one aspect, the invention provides etch solutions effective to etch a doped oxide material selectively relative to a silicon nitride material. An embodiment of the etch solution is an about 5:1:0-3 to 20:1:0-3 (v/v/v) mixture of an organic acid:hydrofluoric acid:inorganic acid, with the etch solution having a pH of about 1 or less, and preferably a pH of less than 1. A preferred etch solution comprises an about 10:1:0-1.5 (v/v/v) mixture of the organic acid:hydrofluoric acid:inorganic acid. The etch solution has a dielectric constant (d.c.) less than that of water (i.e., d.c.<80), which is driven by the organic acid of the solution, and preferably a d.c. of ≦20. In preferred embodiments of the etch solution, the organic acid has a dielectric constant of about 3 or less, with propionic acid and butyric acid being preferred organic acids. The etch solution is formulated to effectively etch a doped oxide material relative to low temperature silicon nitride material at a selectivity of about 250:1-400:1 or greater, and to etch a doped oxide material relative to high temperature silicon nitride material at a selectivity of about 1000-1500:1 or greater. Where an inorganic acid is included (e.g., $HNO_3$), the etch solution is formulated such that the etch rate of a polysilicon material is less than about 10 Å/minute, preferably as an about 5:1:≦3 to 20:1:≦3 (v/v/v) mixture of an organic acid:hydrofluoric acid:inorganic acid, and more preferably an about 10:1:≦1.5 (v/v/v) mixture.

In a preferred embodiment, the etch solution comprises hydrofluoric acid (50% by wt. solution), an organic acid (100% by wt. solution) having a d.c.≦3, with propionic acid being preferred, and optionally an inorganic acid (60% solution) with nitric acid being preferred. It is preferred that water within the etch solution is derived solely from ingredient components, and is not added as a separate or additional component.

In another aspect of the invention, methods of etching a doped oxide material utilizing the etch solutions of the invention are provided. In one embodiment of the method, the etch solution can be applied to etch a doped oxide material selectively relative to an exposed low temperature silicon nitride material (e.g., HCD silicon nitride) at a selectivity of about 250:1-400:1 or greater. In another embodiment, the etch solution can be applied to etch a doped oxide material selectively relative to an exposed high temperature silicon nitride (e.g., DCS silicon nitride) material at a selectivity of about 1000-1500:1 or greater. In a further embodiment, the etch solution can be applied to etch a doped oxide material selectively relative to polysilicon overlying silicon nitride and/or titanium nitride, with a preferred etch rate of the polysilicon of less than about 10 Å/minute.

In a further aspect, the invention provides methods of forming a plurality of capacitor devices. In one embodiment, the method comprises providing a construction comprising a doped oxide layer, and an overlying silicon nitride layer; forming openings extending into the doped oxide layer; forming a conductive container structure comprising a conductive material layer within the openings, the conductive container structure having an opening extending therein, a outer surface along the doped oxide layer, and laterally opposed inner surface within the opening; removing a portion of the silicon nitride layer to expose the doped oxide layer adjacent a segment of the outer surface of the conductive container structures, while retaining portions of the silicon nitride layer connecting adjacently positioned conductive container structures; and removing a portion of the doped oxide layer selectively relative to the silicon nitride and the conductive material layer to expose the segment of the outer surface of the conductive container structures by applying an etch solution according to the invention.

In another embodiment of the method, in a step prior to removing the silicon nitride layer to exposed the doped oxide layer, a layer of polysilicon can be formed over the silicon nitride layer and the conductive material layer within the openings; a portion of the polysilicon layer and the silicon nitride layer can be removed to expose the doped oxide layer adjacent a segment of the outer surface of the conductive container structures, while retaining portions of the silicon nitride layer connecting adjacently positioned conductive container structures; and a portion of the doped oxide layer can be removed selectively relative to the polysilicon layer, the silicon nitride layer, and the conductive material layer to expose the segment of the outer surface of the conductive container structures using an etch solution of the invention.

In another embodiment, a method of forming capacitor devices can include (a) providing a construction comprising a memory cell array region, a peripheral region, and an intermediate region therebetween; a doped oxide layer over said regions; a plurality of electrically conductive container structures within the doped oxide layer over the memory cell array region, the container structures comprising an opening extending therein, an outer sidewall along the doped oxide layer, and laterally opposed inner sidewall within the opening; and a silicon nitride layer overlying portions of the doped oxide layer and interconnecting adjacently positioned conductive container structures, with other portions of the doped oxide layer exposed adjacent a segment of the outer surface of the conductive container structures; and (b) applying an etch solution according to the invention to etch the doped oxide layer selectively relative to the silicon nitride layer to expose the outer surface of the conductive container structures. In another embodiment, the construction can further comprise a layer of silicon overlying the silicon nitride layer. In a further embodiment, the construction can comprise a trench extending into the doped oxide layer over the intermediate region, the trench laterally surrounding the memory cell array, and an electrically conductive layer lining the trench; optionally a layer of silicon can overly the conductive layer within the trench.

The openings can extend in an array comprising rows and columns, and the silicon nitride layer can be patterned to extend between and connect pairs of the rows of the conductive structure array. Following the selective removal of the doped oxide material, the method can further include forming a capacitor dielectric layer over the exposed inner and outer surfaces of the conductive container structures, and forming a second conductive material layer over the capacitor dielectric layer. In embodiments of the construction, the doped oxide is composed of a phosphosilicate glass, the silicon nitride comprises a low temperature silicon nitride (e.g., HCD SiN), and the conductive material layer comprises titanium nitride.

Without being bound by any particular theory, it is believed that the effectiveness of the current etchants in providing a highly selective etch of doped oxides is based, at least in part, on the lack of dissociation of HF within the solution, and driven by pH and the dielectric constant of the solution. Advantageously, the present etch solutions and methods provide a significant improvement in doped oxides selectivity relative to silicon nitride, titanium nitride, and silicon materials, compared to existing etching processes. The increased etch selectivity allows for higher density components in microelectronic devices, and increased precision in the fabrication of such devices. In addition, the improved etch selectivity and etch rates provided by the present etch composition significantly increase throughput during the manufacture of micro-devices. The present etch solutions enable the implementation of a low temperature flow, and the use of HCD nitride as a processing layer, for which there is no viable etch chemistries available for the present application.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 2A-6A are fragmentary top views of the wafer fragments of FIGS. 2-6, respectively, including the cross-sectional side views of FIGS. 2-6 along line 2-2 to line 6-6, and the cross-sectional side view of FIGS. 5B and 6B along lines 5B-5B and 6B-6B, respectively.

FIGS. 8A-11A are fragmentary top views of the wafer fragments of FIGS. 8-11, including the cross-sections of FIGS. 8-11 taken along line 8-8 through 11-11, and the cross-sections of FIGS. 8B-11B taken along line 8B-8B through 11B-11B, respectively.

DETAILED DESCRIPTION OF THE INVENTION

The following description with reference to the figures provides an illustrative example in the fabrication of DRAM integrated circuitry (IC) construction. Such description is only for illustrative purposes and it is to be understood that the invention can have application to other constructions and technologies, including, for example, constructions associated with display applications, microelectromechanical systems (MEMS), matrix applications, etc. Thus, the present invention is not limited to the described illustrative devices.

In the context of the current application, the terms "semiconductor substrate" or "semiconductive substrate" or "semiconductive wafer fragment" or "wafer fragment" or "wafer" will be understood to mean any construction comprising semiconductor material including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

For purposes of this disclosure, an etch is considered to be selective to a second material if the etch removes the first material at a faster rate than the second material including, but not limited to, conditions in which the second material is substantially not removed during the removal of the first material, i.e., conditions in which the rate of removal of the second material is essentially zero (0).

Steps in an embodiment of a method according to the invention for the fabrication of a container capacitor are illustrated in FIGS. 7-11. The illustrated example is not meant to be limiting. The present invention overcomes problems in the prior art in etching doped oxide materials in the presence of silicon nitride, particularly HCD silicon nitride, TiN, and polysilicon.

In the embodiment illustrated in FIGS. 7-11, wafer fragment 10' includes a substrate 12', which can comprise an unprocessed semiconductor wafer or other substrate, the wafer with various process layers formed thereon including one or more semiconductor layers or other formations, and active or operable portions of semiconductor devices. A semiconductor device can comprise a transistor, capacitor, electrode, insulator, or any of a variety of components commonly utilized in semiconductor structures. In the illustrated example, the substrate 12' comprises a semiconductive material such as monocrystalline silicon that is lightly doped with a conductivity enhancing material (e.g., p-type dopant).

Figure 1:
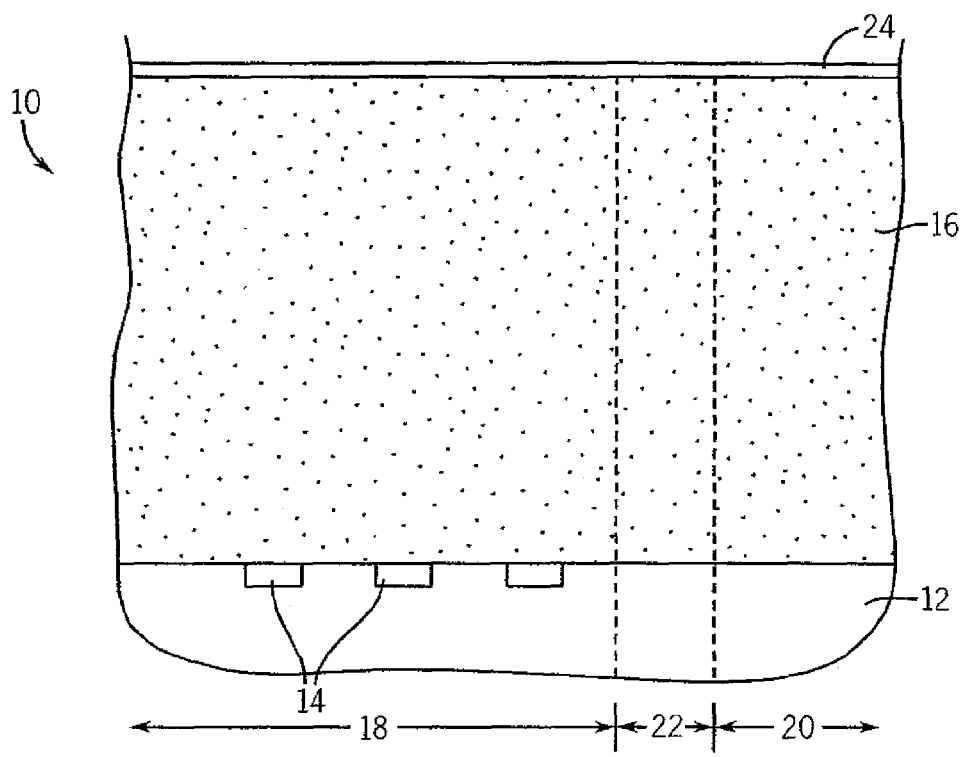
FIG. 1 is a diagrammatic, elevational, cross-sectional side view of a semiconductor wafer fragment at a preliminary processing state of a prior art method for forming double-sided container capacitors.
Figure 1A:
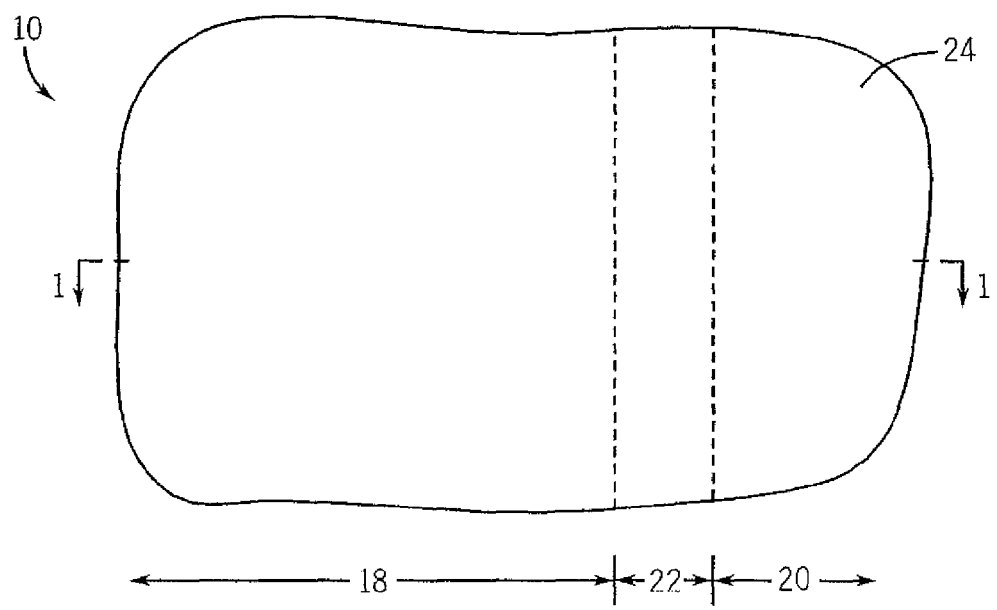
FIG. 1A is a fragmentary top view of the wafer fragment of FIG. 1, including the cross-section of FIG. 1 along line 1-1.
Figure 2:
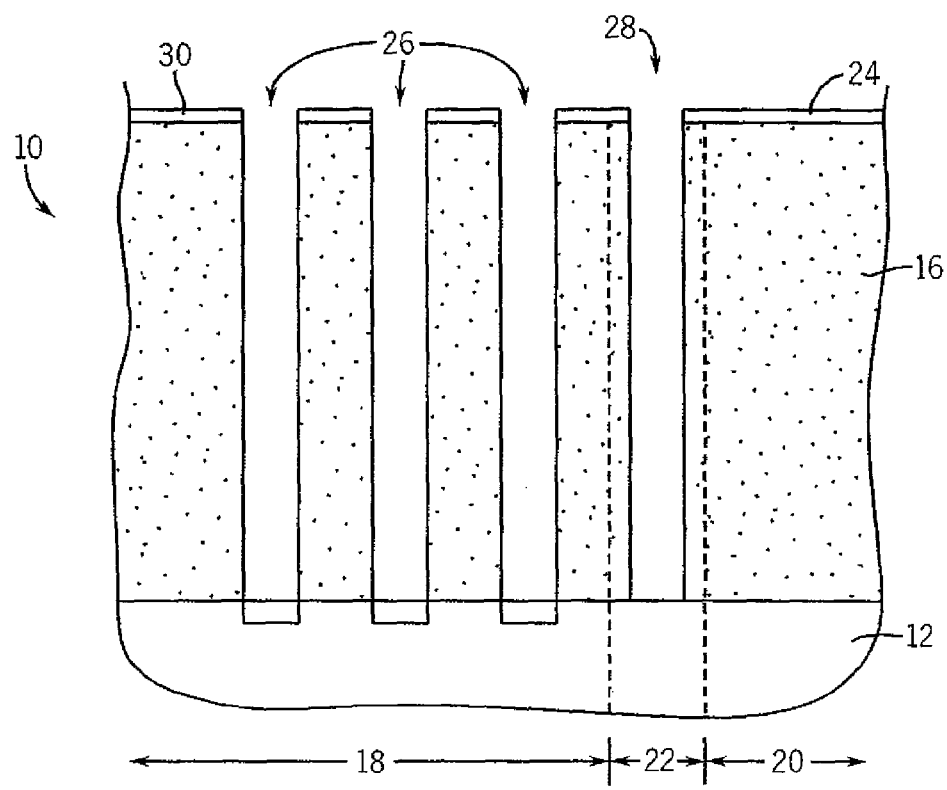
FIGS. 2-6 are diagrammatic, elevational, cross-sectional side views of the wafer fragment of FIG. 1 shown at sequential and subsequent processing steps of the prior art method.
Figure 2A:
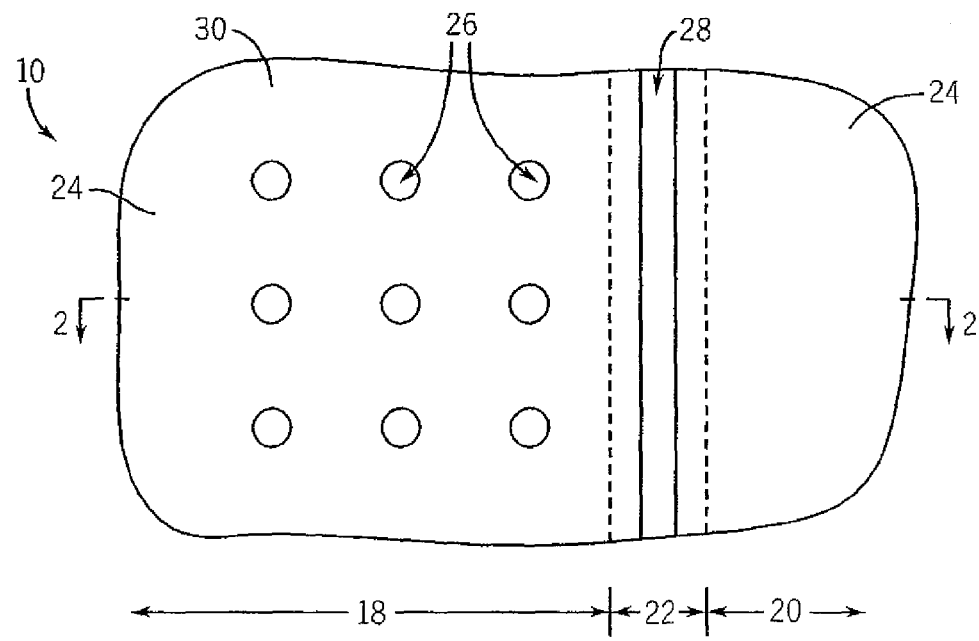
Figure 3:
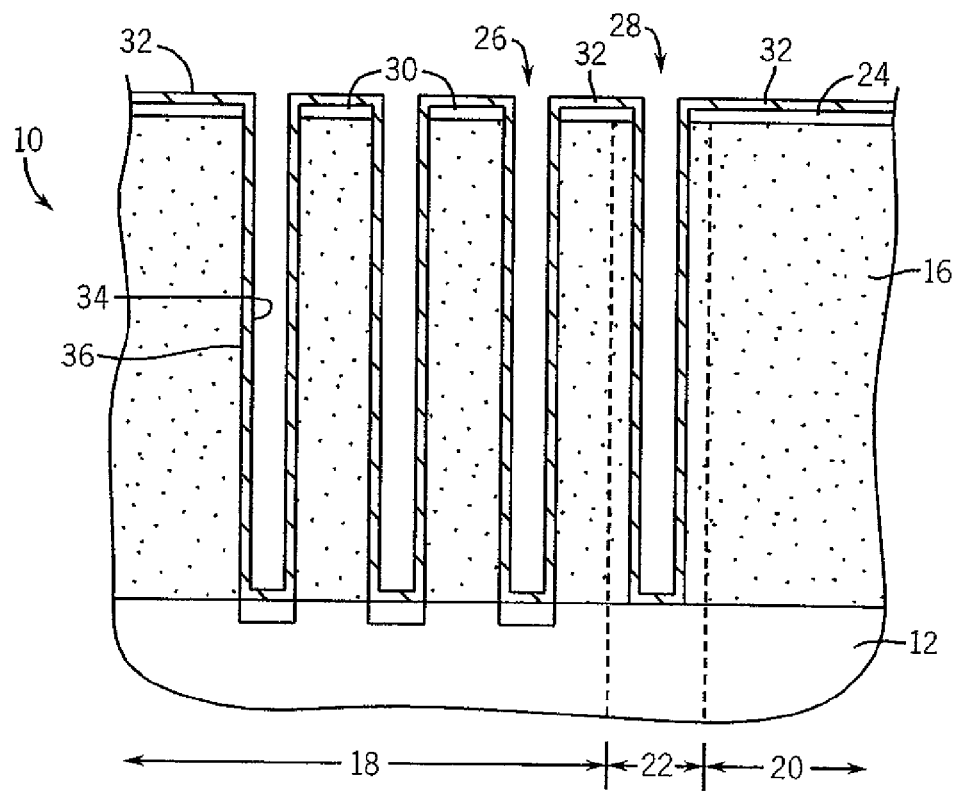
Figure 3A:
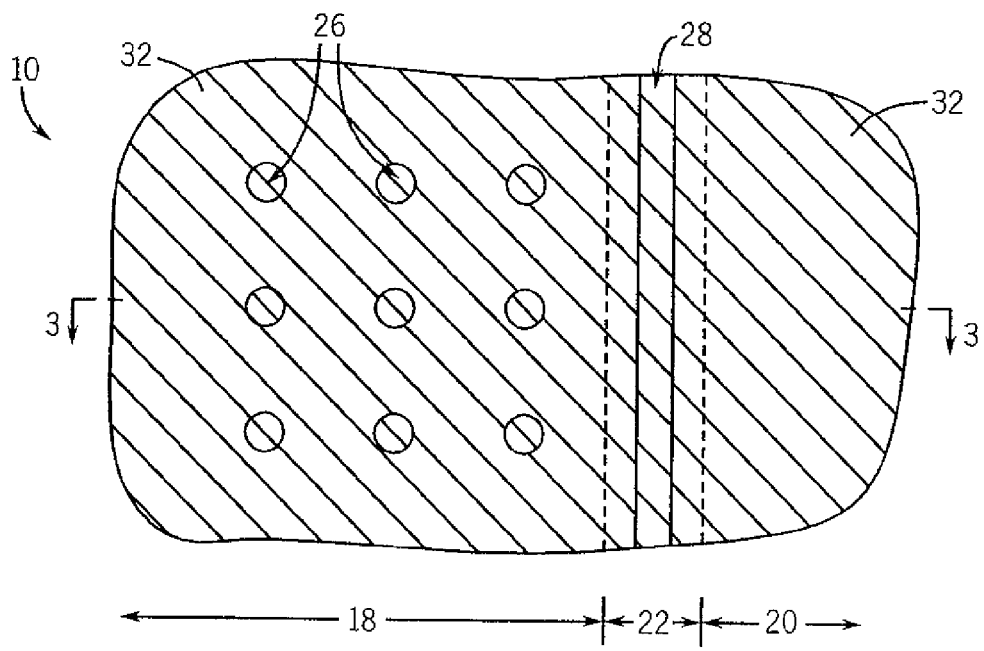
Figure 4:
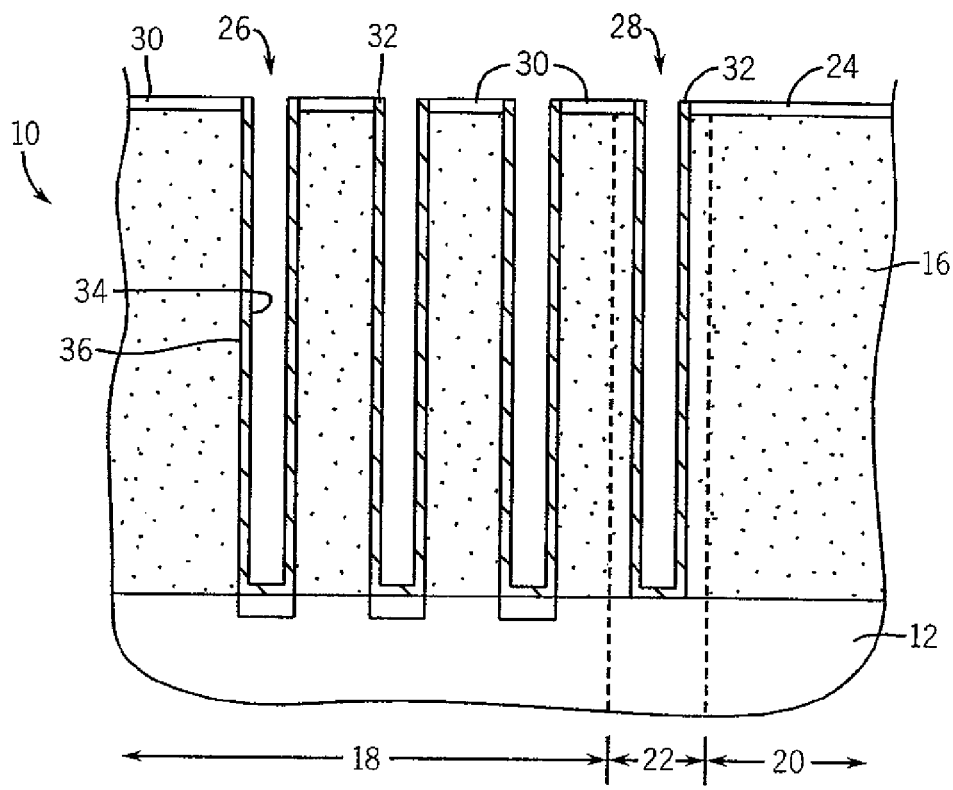
Figure 4A:
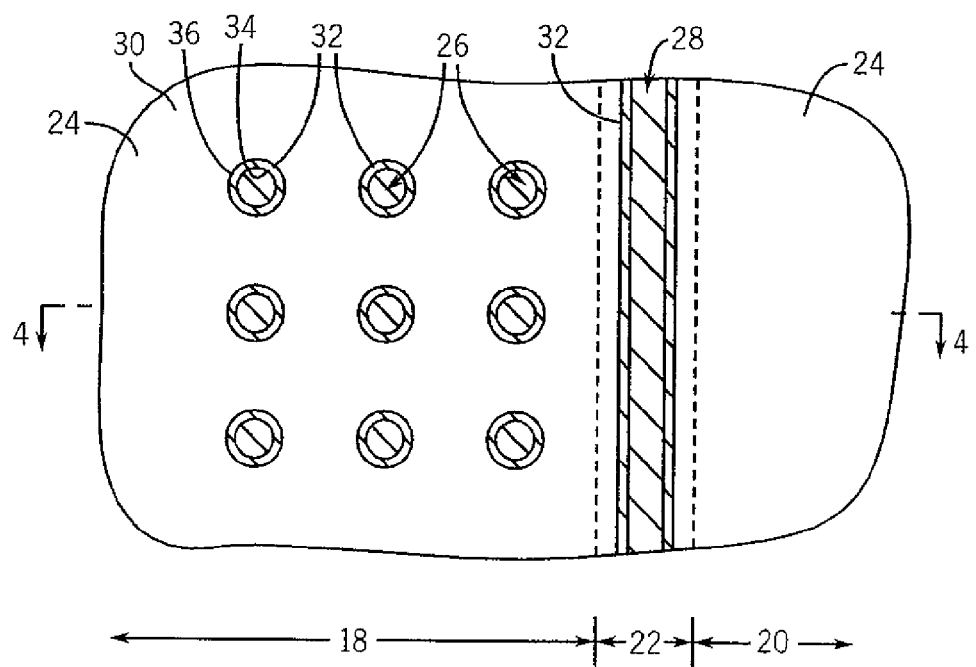
Figure 5:
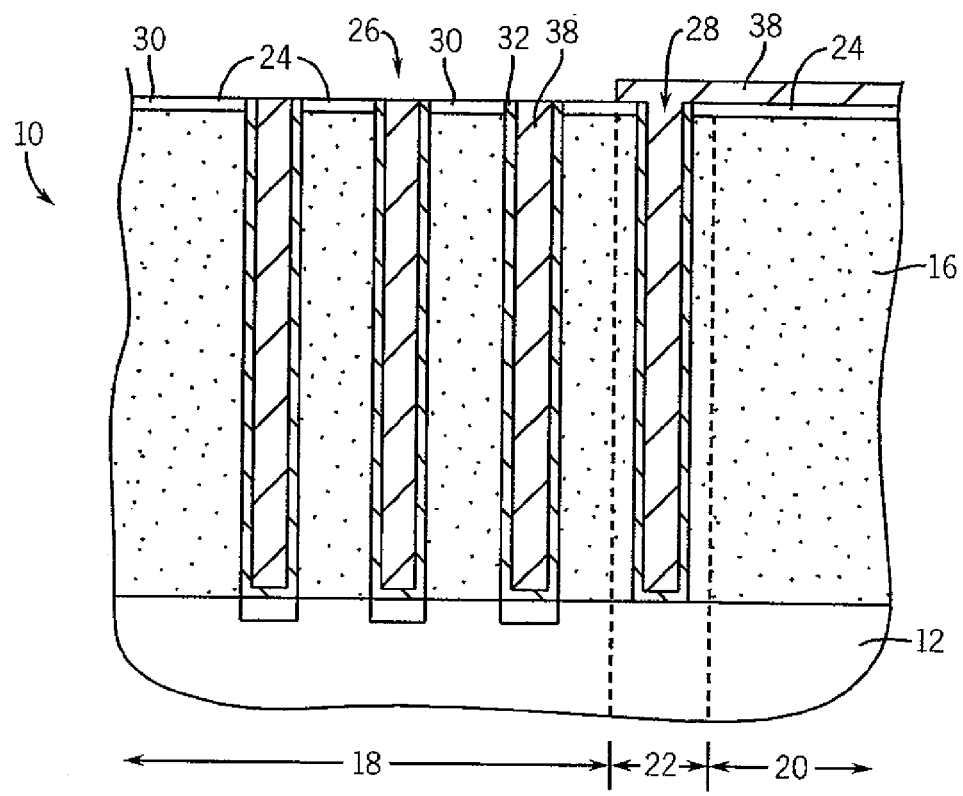
Figure 5A:
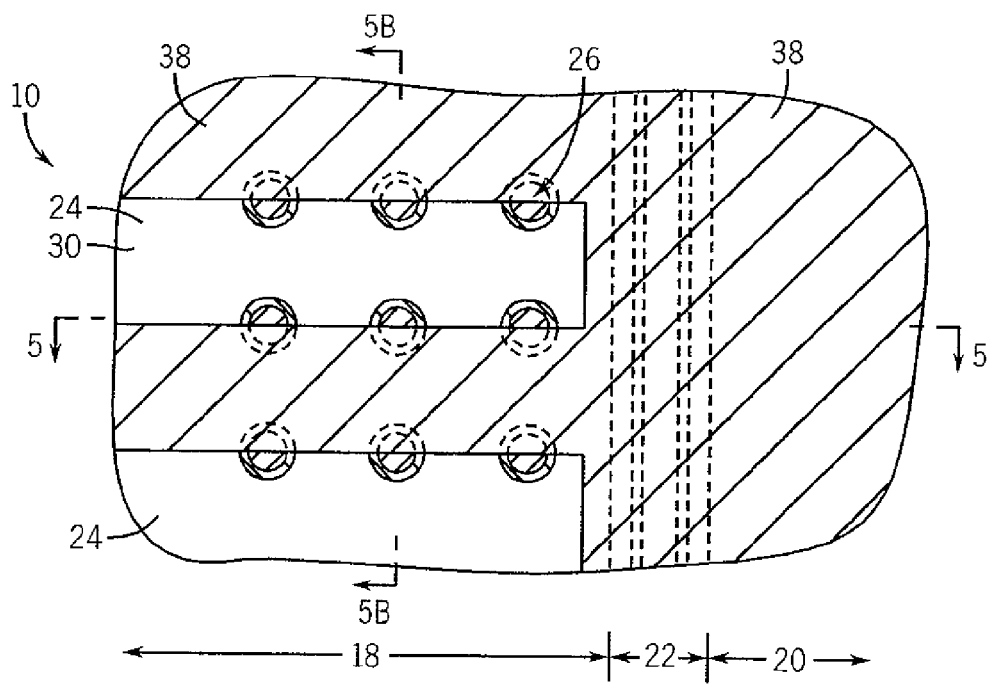
Figure 5B:
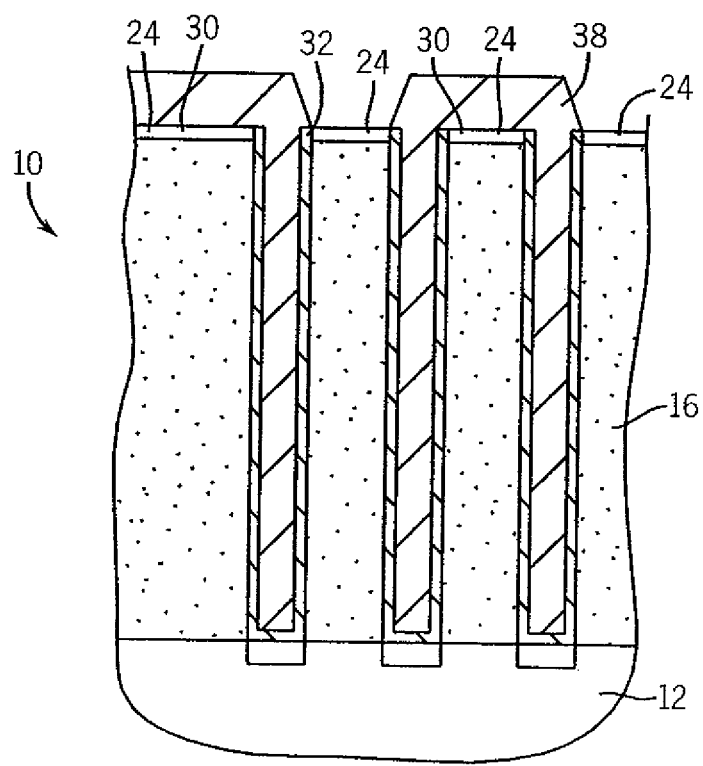
Figure 6:
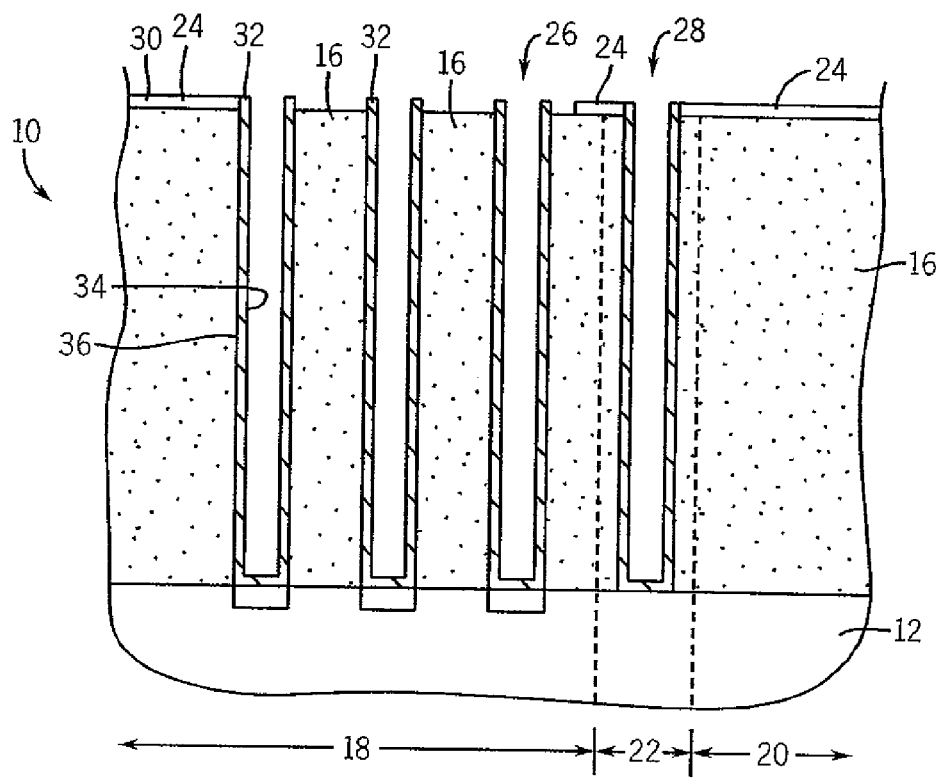
Figure 6A:
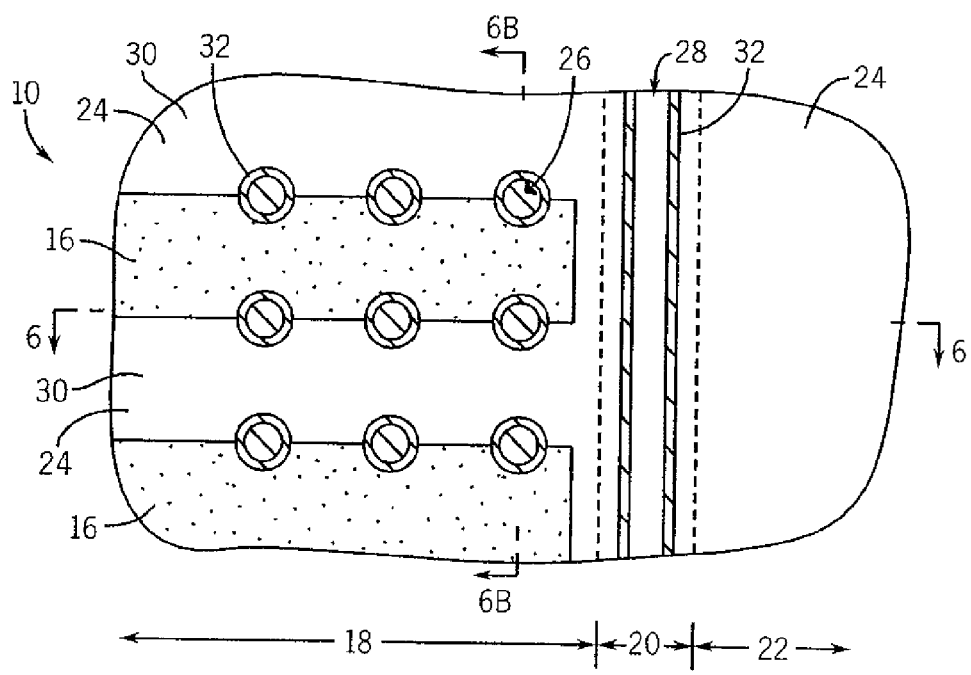
Figure 6B:
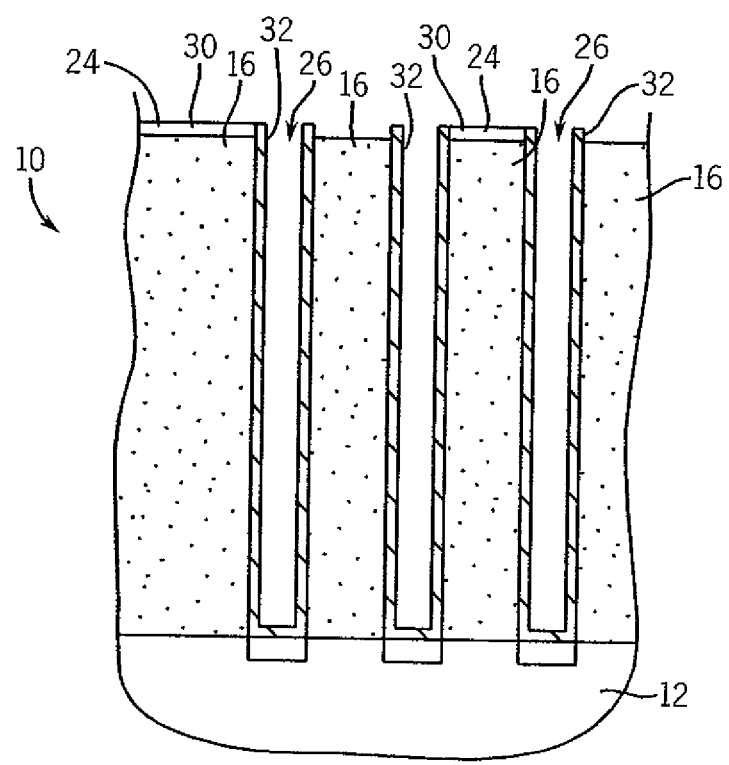

Preliminary processing steps for forming a container capacitor according to the invention can be performed by conventional methods. Referring to FIG. 1, a SiN layer 24' can be deposited over a doped oxide layer 16'. The doped oxide layer 16' can then be etched to form container openings 26 in the memory cell array region 18 and a trench 28 in the intermediate area 22 (FIG. 2). A TiN layer 32 can then be deposited (FIG. 3). The TiN layer 32 can then be etched to form the bottom electrodes within the container openings 26 and to line the trench (moat) 28 (FIG. 4). As shown in FIG. 4, portions of the SiN layer 24' including the SiN lattice portion 30' are now exposed.

Figure 7:
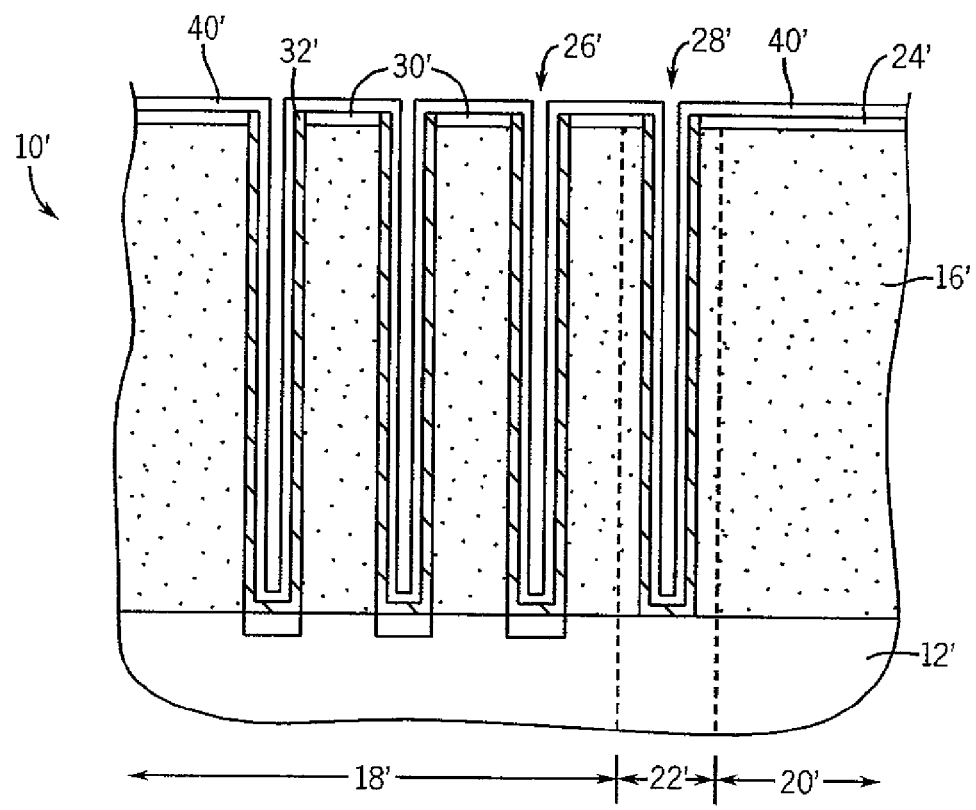
FIG. 7 is a diagrammatic, elevational, cross-sectional view of a semiconductor wafer fragment at a processing step according to an embodiment of the invention, being subsequent to the prior art processing step of FIG. 4 and 4A.
Figure 7A:
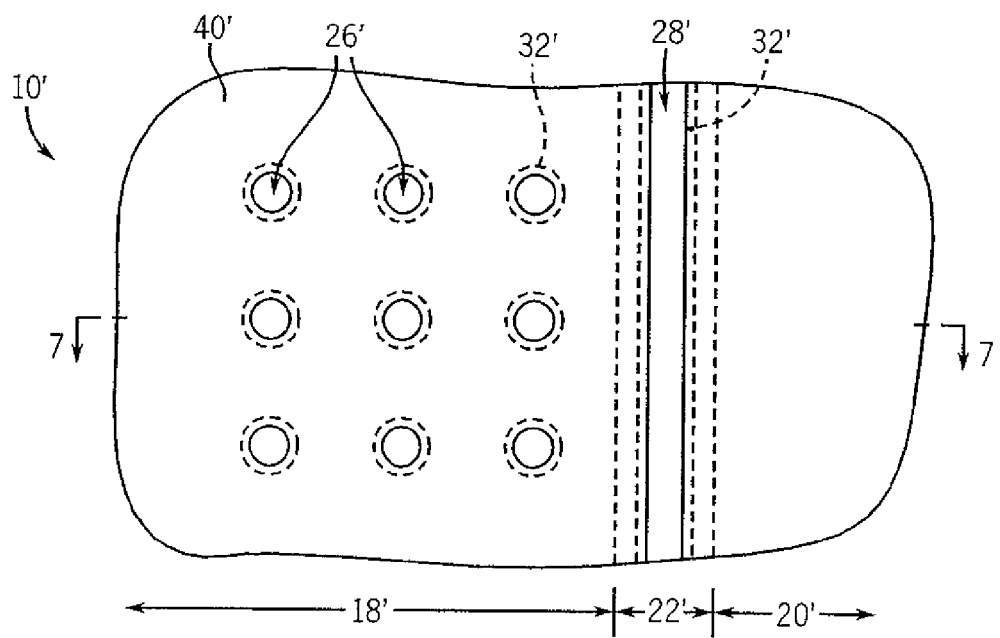
FIG. 7A is a fragmentary top view of the wafer fragment of FIG. 7, including the cross-section of FIG. 7 taken along line 7-7.

According to the invention, it is desirable, though not required, to deposit a sacrificial layer 40' of undoped polysilicon over the TiN layer 32' and the SiN layer 24' including lattice portion 30' prior to etching the doped oxide layer 16', which is illustrated in FIGS. 7 and 7A. A preferred thickness of the polysilicon layer 40' is about 80-150 Å. The polysilicon layer can be deposited by a known deposition process such as PECVD, LPCVD, and the like. The polysilicon material layer is resistant to the doped oxide etch chemistries of the invention, and functions to protect the underlying SiN and TiN layers 24' and 32', respectively, during the removal of the doped oxide layer 16', and also to prevent leakage of the etch solution into the doped oxide layer 16' of the peripheral area 20' through pinholes that may occur within the TiN layer 32' of the trench 28'.

Figure 8:
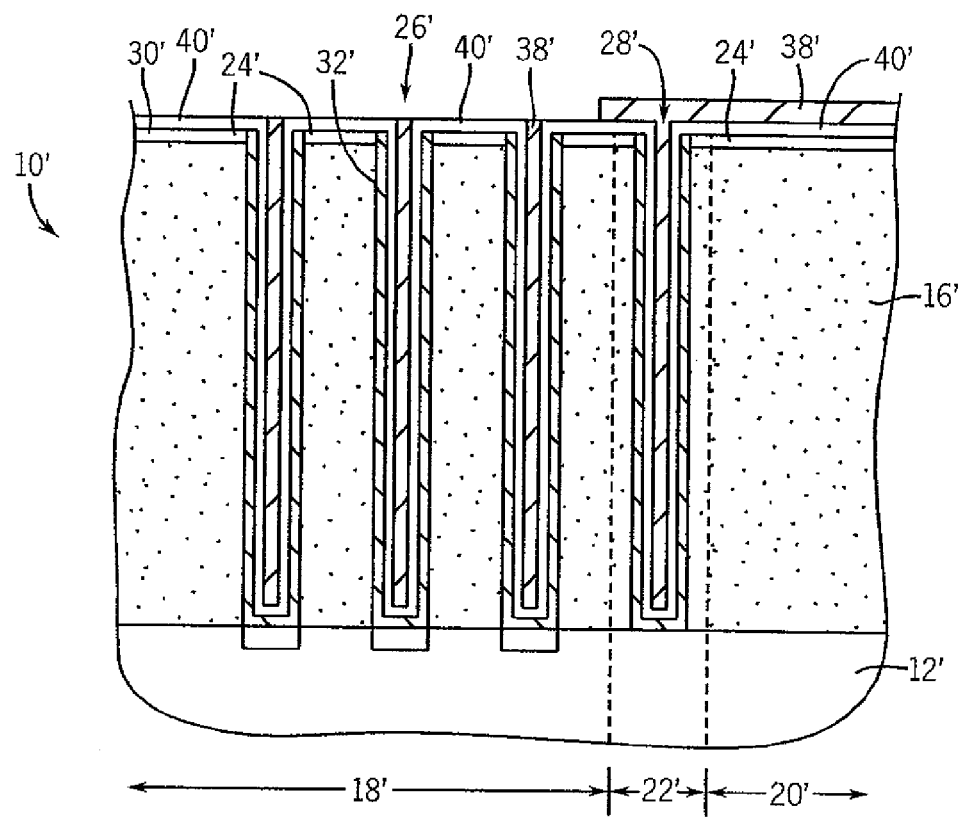
FIGS. 8-11 are diagrammatic, elevational, cross-sectional side views of the FIG. 7 wafer fragment shown at sequential and subsequent processing steps according to an embodiment of the invention.
Figure 8A:
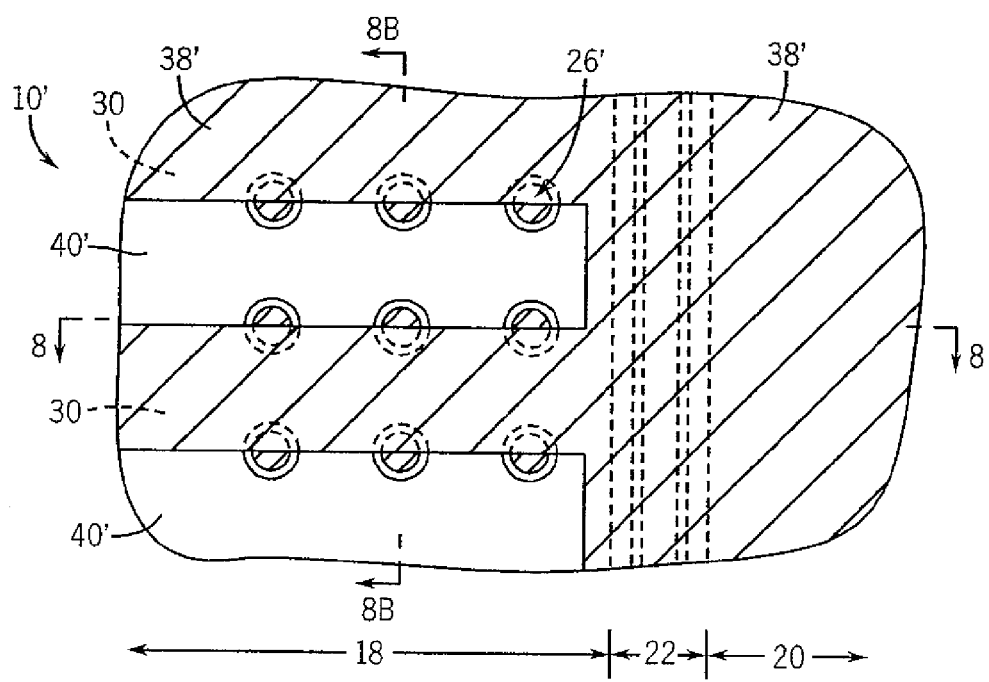
Figure 8B:
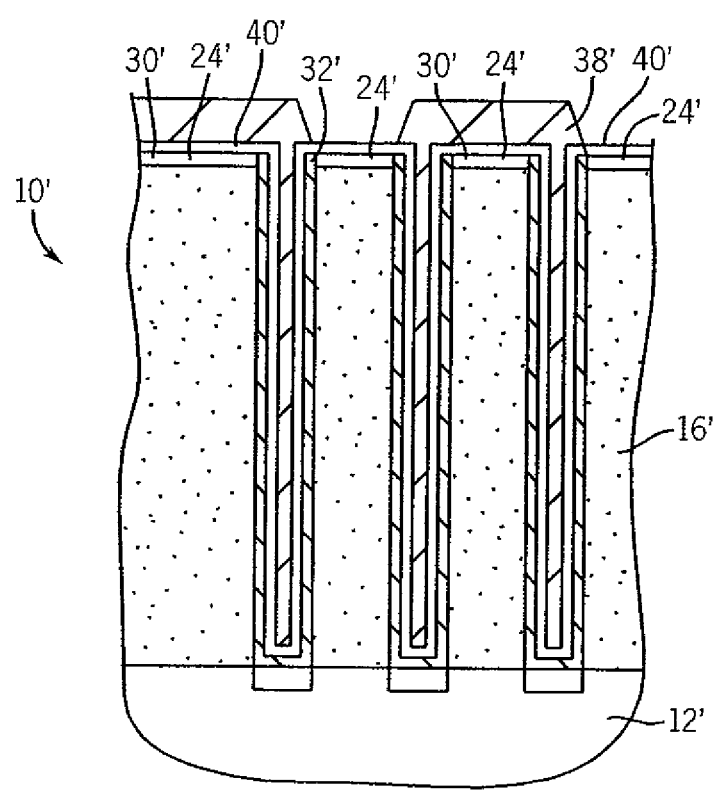
Figure 9:
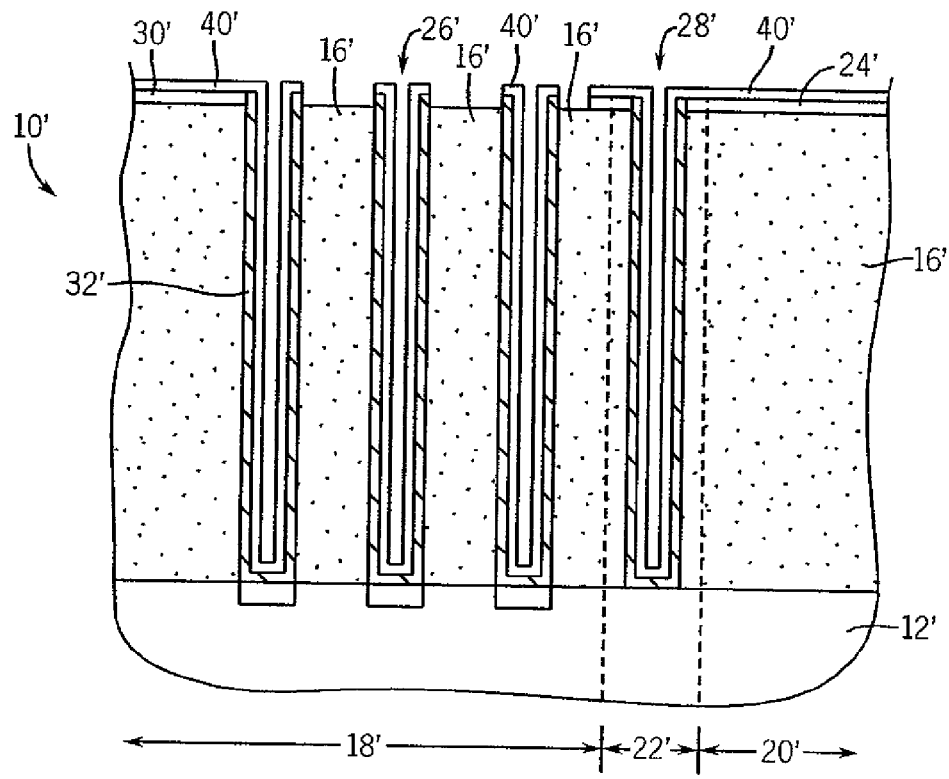
Figure 9A:
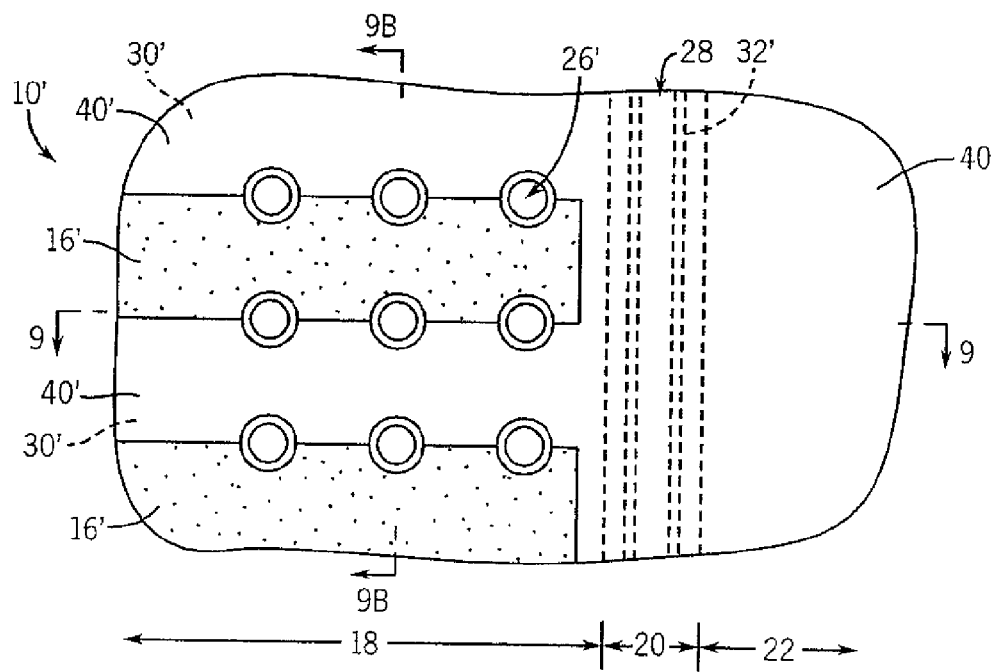
Figure 9B:
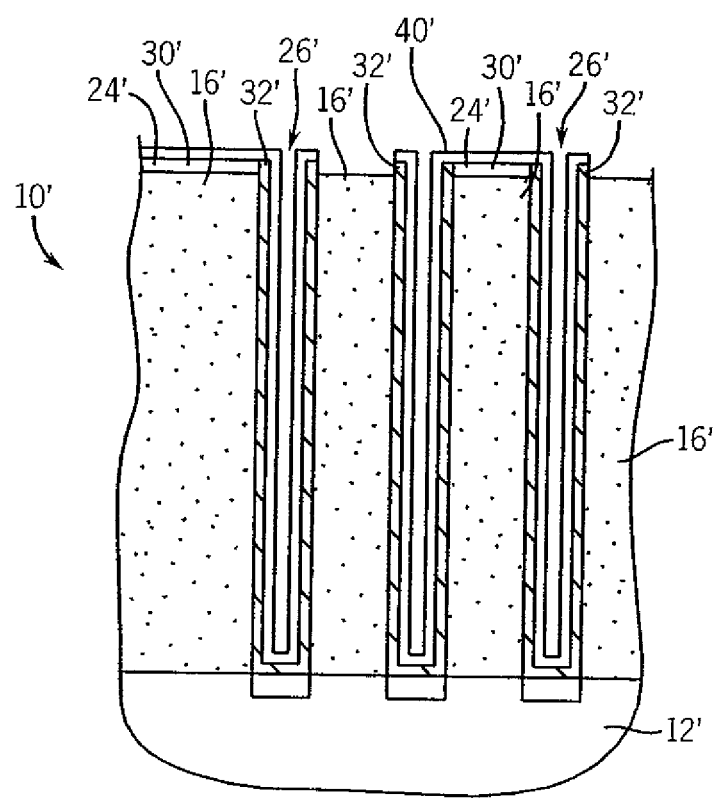

In a next step, a patterned photoresist masking layer 38' is then formed over the polysilicon layer 40', as depicted in FIGS. 8 and 8B. Then, portions of the undoped polysilicon layer 40' and SiN layer 24' within the lattice portion 30' are sequentially removed, for example, by conventional dry etch, to expose the doped oxide layer 16' between pairs of the capacitor container opening 26' structures within the memory cell array region 18', as illustrated in FIGS. 9 and 9B. The remaining portions of the lattice portion 30' support adjacent capacitor container 26' pairs.

Figure 10:
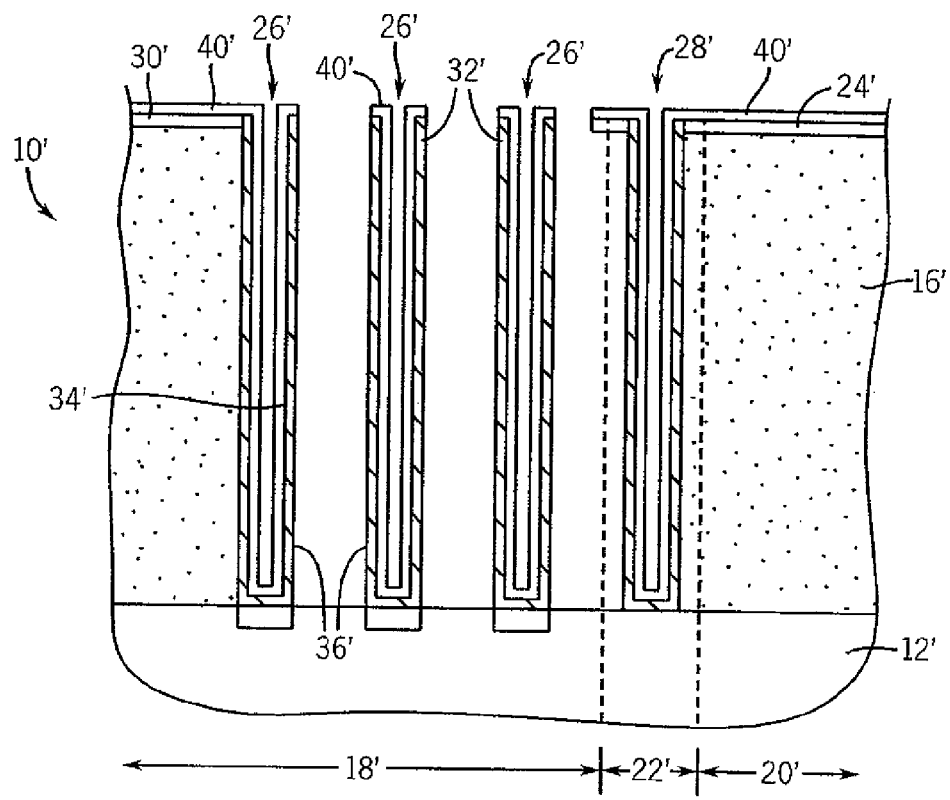
Figure 10A:
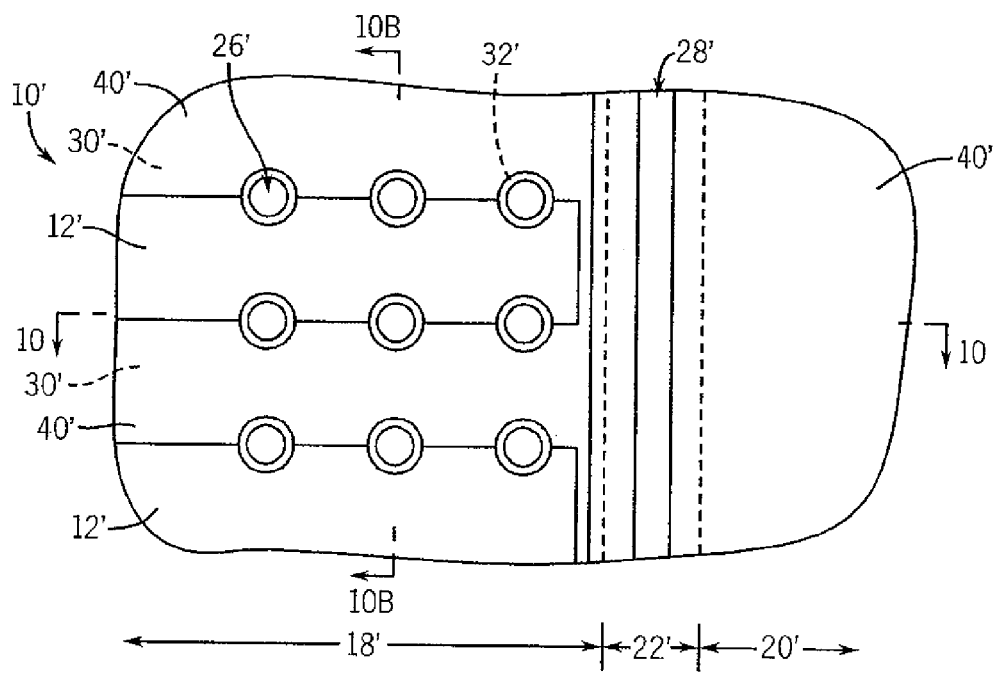
Figure 10B:
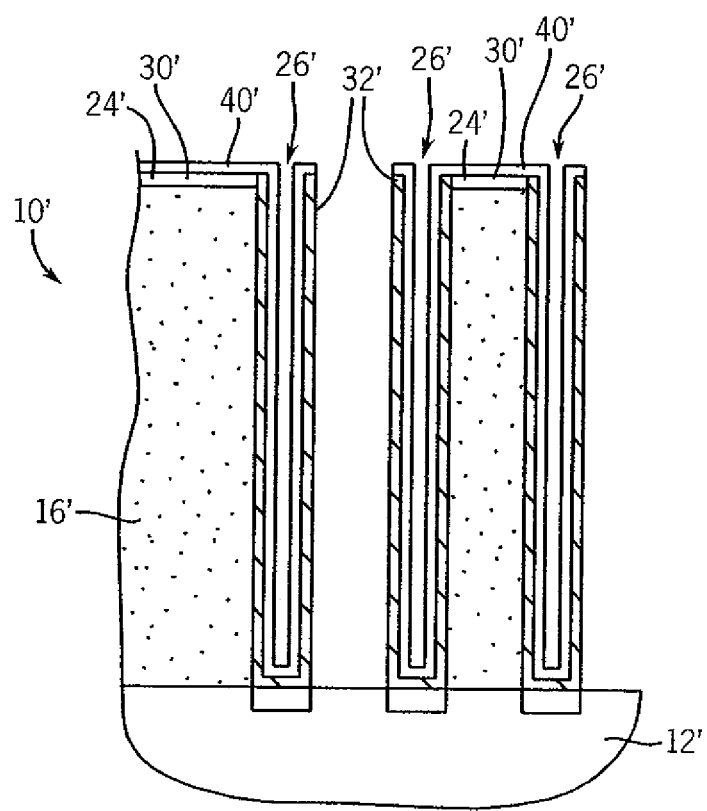

The doped oxide layer 16' in the memory cell array region 18' is then selectively and isotropically wet etched from along all or part of the outer surfaces 36' of the TiN (electrode) layers 32' between pairs of capacitor container 26' structures using an etch solution according to the invention. This step is illustrated in FIGS. 10 and 10B.

The etch solution of the invention can be used to effectively etch doped oxide at a high rate and with a high selectivity relative to silicon nitride, polysilicon, and TiN. In particular, the etchant compositions etch doped oxides with a high selectivity relative to HCD nitride.

The present etchant compositions are formulated to provide a high concentration of undissociated HF in solution. The etchants are composed of an acidic mixture of hydrofluoric acid (HF) in an organic acid having a lower dielectric constant (d.c.) than deionized water (DI) (d.c.=80).

The dielectric constant of the organic acid is preferably 20 or less, preferably 10 or less, more preferably 3.5 or less. Exemplary low dielectric constant organic acids include propionic acid (relative dielectric constant: 3.4 (40° C.)), butanoic (or butyric) acid (relative dielectric constant: 2.97 (20° C.)), isobutyric-acid (relative dielectric constant. 2.73 (40° C.)), valeric acid, caproic acid (relative dielectric constant: 2.63 (71° C.)), caprylic acid (relative dielectric constant: 2.45 (20° C.)), acetic acid (relative dielectric constant: 6.15 (20° C.)), monochloroacetic acid (relative dielectric constant: 21 (20° C.)), dichloroacetic acid (relative dielectric constant: 8.08 (20° C.)), trichloroacetic acid (relative dielectric constant: 4.6 (60° C.)), monofluoroacetic acid, difluoroacetic acid, trifluoroacetic acid, α-chlorobutyric acid, β-chlorobutyric acid, γ-chlorobutyric acid, lactic acid (relative dielectric constant: 22 (70° C.)), glycolic acid, pyruvic acid, glyoxalic acid, acrylic acid, and like monocarboxylic acids, methanesulfonic acid, toluenesulfonic acid, and like sulfonic acids, oxalic acid, succinic acid, adipic acid, tartaric acid, citric acid, and like polycarboxylic acids. A preferred organic acid is propionic acid, preferably as a 100% solution.

To increase the etch selectivity of doped oxide relative to silicon nitride, the etch solution can further include an inorganic acid, for example, nitric acid ($HNO_3$), sulfuric acid ($H_2SO_3$), hydrochloric acid (HCl), phosphoric acid ($H_3PO_4$), and the like. Where included in the etch solution, the amount of the inorganic acid is maintained at a low concentration (about 3 parts by volume or less, and preferably about 1.5 parts by volume or less) to avoid etching a significant amount of TiN and polysilicon, particularly with regard to the TiN layer 32' and the undoped polysilicon layer 40'.

In preferred embodiments, the etchant is composed of a mixture of an organic acid:HF:inorganic acid in a ratio of about 5:1:0-3 to about 20:1:0-3 (v/v/v), preferably in a ratio about 10:1:0-1.5 (v/v/v). The organic acid can be combined with a 49% by wt. HF aqueous solution, although a higher concentration HF solution is preferred, for example, a 50% by wt. HF solution. In preferred embodiments, the etchant is composed of propionic acid (100%), HF (50%), and optionally $HNO_3$ (60%). A preferred processing temperature of the doped oxide etch is about 20° C. to 30° C., with about room temperature (about 24° C.) being preferred.

Without being bound by any particular theory, it is currently believed that several factors contribute to the effectiveness of the present etchant composition and methods for selectively etching doped oxide. Due to the high concentration of acids, the etch solutions have an effective pH of about 1 or less. It is believed that, as a result of the low pH and the use of lower dielectric constant solvents (i.e., lower d.c. than water), a higher concentration of undissociated molecular HF and $H_2F_2$ is maintained within the present etch solutions as opposed to $H^+$, $F^-$, $HF^{2-}$, or ionic other species produced when HF dissociates in solution, as compared to conventional DI:HF etch solutions. By preventing dissociation of the HF present in the etch solutions, the HF is forced to remain in its molecular form, which significantly increases the selectivity of the present etch solutions to doped oxide relative to silicon nitride. This greatly reduces the potential for damage to the desired substrate features (i.e., the TiN bottom electrode layer 32') during exposure of the substrate 12' to the etchant solutions. It is also believed that the inclusion of an inorganic acid (e.g., $HNO_3$) plays a role as an oxidizer in the removal of the doped oxide, which requires control as to amount used to maintain acceptable selectivities to TiN and polysilicon.

The etchant compositions provide a highly selective etch of doped oxides relative to both low temperature and high temperature silicon nitrides. The present compositions provide an etch of a doped oxide selectively relative to a high temperature silicon nitride (e.g., DCS SiN) of at least about 700:1 to up to about 1000:1 and greater, and an etch selectivity of a doped oxide relative to a low temperature silicon nitride (e.g., HCD SiN) of at least about 150:1 to up to about 350:1. The compositions of the invention also provide an about 4000:1 selectivity of PSG:polysilicon and PSG:TiN, an about 6:1 selectivity of PSG:USG (undoped silicon glass), an about 30:1 selectivity of PSG:TEOS oxide, and an about 25:1 selectivity of PSG:undoped spin-on dielectrics (e.g., hydrogen silsesquioxane (HSQ), hexamethyldisiloxane, octamethyltrisiloxane, etc.). In some embodiments, the etch solutions provide a selective etch of a doped oxide material relative to a silicon nitride at an etch rate of about 20,000 Å/minute or greater, and at a selectivity of about 250-400:1 relative to a low temperature silicon nitride material and at a selectivity of about 1000-1500:1 relative to a high temperature silicon nitride material.

The polysilicon layer 40' remaining over the SiN layer 24' can then be removed by a conventional selective wet etch.

Figure 11:
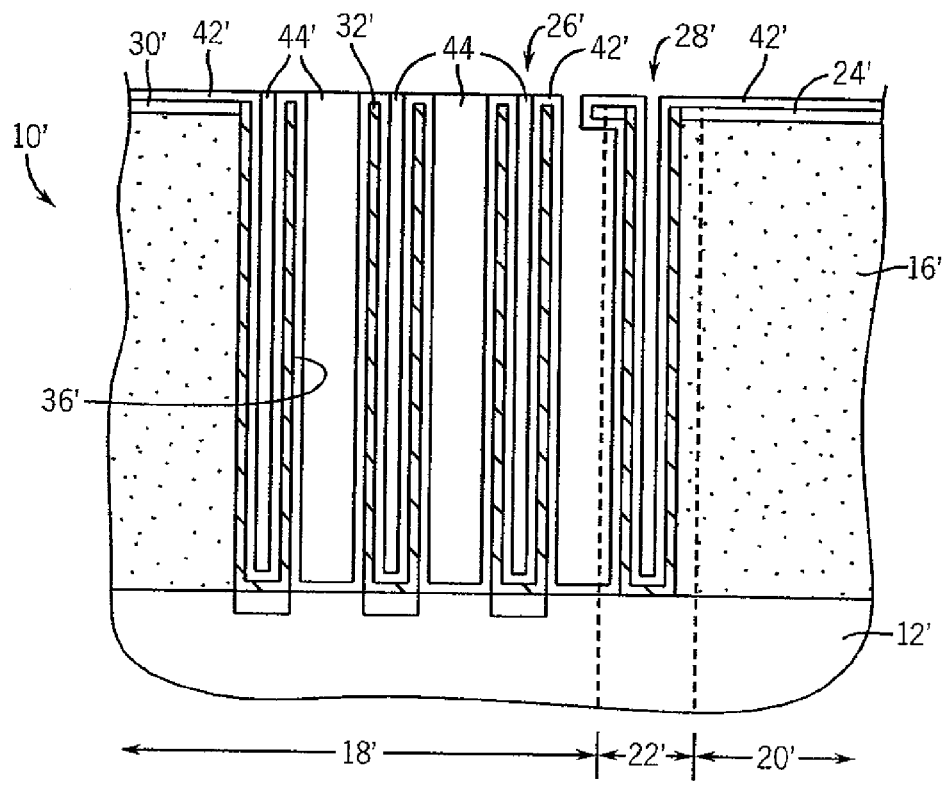
Figure 11A:
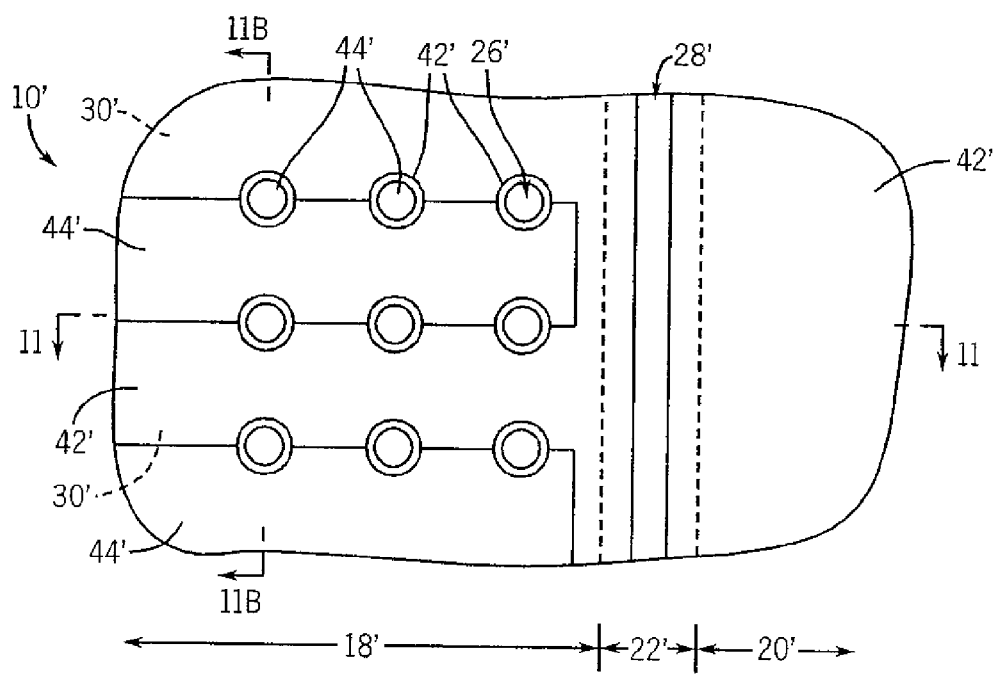
Figure 11B:
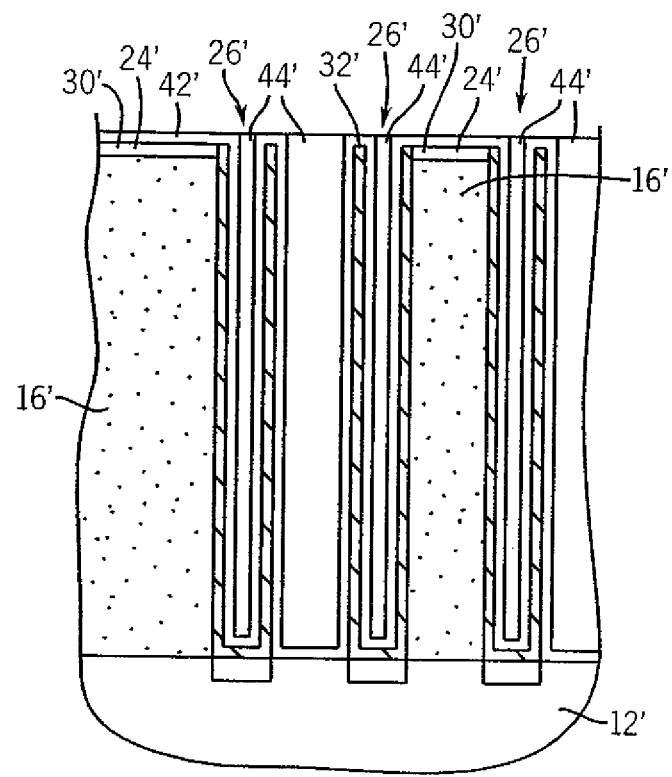

Referring next to FIGS. 11-11B, a capacitor dielectric material layer 42' and a conductive material layer 44' are then deposited within the openings 26' and along the outer surfaces 36' of the TiN bottom electrode 32'. The conductive material layer 44' forms the second or upper electrode, which together with the TiN bottom electrode 32' and the capacitor dielectric layer 42', form an array of capacitor structures within the container openings 26'. The wafer 10' can then be processed further as desired.

The resulting capacitor structures can be used in a variety of applications including, for example, programmable memory devices, programmable resistor and capacitor devices, optical devices, and sensors, among others. A semiconductor die can be produced from the wafer 10' that contains at one of the capacitor structures such as depicted in FIG. 11. The die can further contain additional circuitry to extend to another device such as a processor. The die is typically packaged in a protective casing with leads providing access to circuitry of the die.

Figure 12:
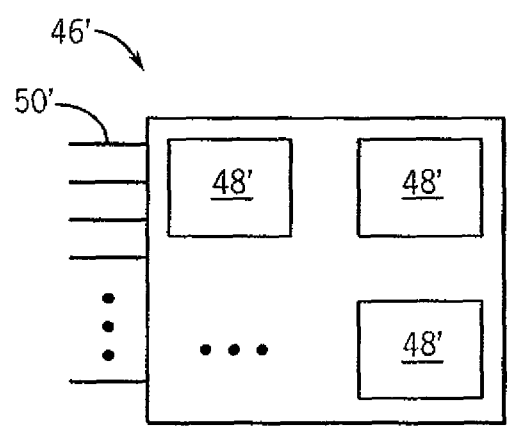
FIG. 12 is a block diagram of an embodiment of a system in which a container capacitor processed according to the invention can be used.

FIG. 12 is a block diagram of an embodiment of a circuit module 46' in which the present invention can be incorporated. Such modules, devices and systems (e.g., processor systems) incorporating the module are described and illustrated in U.S. Pat. Nos. 6,437,417 (Gilton) and 6,465,828 (Agarwal), the disclosures of which are incorporated by reference herein. In brief, two or more dies that contain container capacitor structures such as those depicted in FIG. 11 can be combined into a circuit module 46' to enhance or extend the functionality of an individual die. Circuit module 46' can be a combination of dies 48' representing a variety of functions, or a combination of dies containing the same functionality. One or more dies of the circuit module can contain circuitry, or integrated circuit devices, that includes at least one container capacitor structure processed in accordance with the embodiments of the present invention. Some examples of a circuit module 46' include memory modules, device drivers, power modules, communication modems, processor modules, and application-specific modules, and may include multilayer, multichip modules. Examples of multi-chip modules (MCMs) include a single in-line memory module (SIMM), a dual in-line memory module (DIMM), a random access memory (RAM) card or module, and a read-only-memory (ROM) card or module. Circuit module 46' can be a subcomponent of a variety of electronic systems, such as a clock, a television, a cell phone, a personal computer, a hand-held device, an automobile, an industrial control system, an aircraft, among others. Circuit module 46' will have a variety of leads 50' extending therefrom and coupled to dies 48' providing unilateral or bilateral communication and control.

The circuit module 46' can be incorporated, for example, into an electronic system that comprises a user interface, for example, a keyboard, monitor, display, printer, speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent, and optionally user interface components, and other associated components such as modems, device interface cards, etc. Examples of memory circuits include but are not limited to DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

EXAMPLE

The following example was conducted to study the effect of varying etchant formulations and v/v ratios of components on the selective removal of PSG (phosphosilicate glass) relative to a low temperature silicon nitride (DCS SiN) and a high temperature silicon nitride (HCD SiN).

Wafers were provided with exposed layers of PSG and silicon nitride (DCS SiN or HCD SiN), and immersed for 30 seconds in a bath containing the etch solution shown in the table below. The bath temperature was room temperature (i.e., 23° C.).

The results are shown in the table below.

| | | Selectivity[1] | | Etch Rates (Å/min) | | |
|---|---|---|---|---|---|---|
| Etchant solution | Ratio (v) | PSG:DCS-SiN | PSG:HCD-SiN | PSG | DCS SiN (725° C.) | HCD SiN (600° C.) |
| DI:HF (49%)[2] (comparative) | 10:1 | ~200:1 | ~50:1 | ~9600 | ~48 | ~190 |
| DI:HF (49%):HNO$_3$[3] (comparative) | 10:1:1.5 | ~400:1 | ~60:1 | ~14000 | ~35 | ~230 |
| PA:HF (49%)[4] | 10:1 | ~1200:1 | ~270:1 | ~47000 | ~40 | ~180 |
| PA:HF (49%):HNO$_3$[4] | 10:1:1 | Unknown | ~330:1 | ~20000 | Unknown | ~60 |

[1]PSG = phosphosilicate glass; DSC-SiN = dichlorosilane silicon nitride (high temperature deposition); HCD-SiN = hexachlorodisilane (Si$_2$Cl$_6$) silicon nitride (low temperature deposition)
[2]DI = deionized water; HF = hydrofluoric acid (49% by wt.)
[3]HNO$_3$ = nitric acid (60% by wt.)
[4]PA = propionic acid (100% by wt.); HF (49% by wt.)

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents. The disclosures of the cited references are incorporated by reference herein.

What is claimed is:

1. A method of etching a doped oxide material on a substrate, comprising:
    selectively etching the doped oxide material relative to an exposed silicon nitride material on the substrate by applying an etch solution comprising a 5-20:1:>0-3 (v/v/v) mixture of and a monocarboxylic organic acid:hydrofluoric acid:inorganic acid, the organic acid having a dielectric constant of less than 3 and selected from the group consisting of butyric acid, isobutyric acid, valeric acid, caproic acid and caprylic acid.

2. The method of claim 1, wherein the organic acid is butyric acid.

3. The method of claim 1, wherein the etch solution has a pH of about 1 or less.

4. The method of claim 1, wherein the substrate comprises phosphosilicate glass (PSG) and undoped silicon, and the etching has an etch selectivity of PSG:undoped silicon glass of about 6:1.

5. The method of claim 1, wherein the substrate comprises phosphosilicate glass (PSG) and polysilicon, and the etching has an etch selectivity of phosphosilicate glass (PSG):polysilicon at about 4000:1.

6. The method of claim 1, wherein the substrate comprises phosphosilicate glass (PSG) and TEOS oxide, and the etching has an etch selectivity of PSG:TEOS oxide of about 30:1.

7. The method of claim 1, wherein the substrate comprises phosphosilicate glass (PSG) and an undoped spin-on dielectric, and the etching has an etch selectivity of PSG:undoped spin-on dielectric of about 25:1.

8. The method of claim 1, wherein the substrate comprises phosphosilicate glass (PSG) and titanium nitride (TiN), and the etching has an etch electivity of PSG:TiN at about 4000:1.

9. The method of claim 1, wherein the inorganic acid is selected from the group consisting of nitric acid, sulfuric acid, hydrochloric acid, and phosphoric acid.

10. The method of claim 1, wherein the etch solution comprises an about 10:1:>0 to 1.5 (v/v/v) mixture of the organic acid:hydrofluoric acid:inorganic acid.

11. The method of claim 1, wherein the substrate comprises a low temperature, chlorinated, inorganic silicon nitride material, and the etching has an etch electivity of the doped oxide material to the low temperature silicon nitride material at about 150-350:1.

12. The method of claim 1, wherein the substrate comprises a high temperature, chlorinated, inorganic silicon nitride material, and the etching has an etch electivity of the doped oxide material to the high temperature silicon nitride material at about 700-1000:1.

13. A method of etching a doped oxide material on a substrate, comprising: applying an etch solution comprising a 5-20:1:>0-3 (v/v/v) mixture of monocarboxylic organic acid:hydrofluoric acid:inorganic acid to a substrate comprising the doped oxide material and an exposed low temperature, chlorinated, inorganic silicon nitride material to etch the doped oxide material relative to the low temperature silicon nitride material at a selectivity of about 250-400:1, the organic acid having a dielectric constant of less than 3 and selected from the group consisting of butyric acid, isobutyric acid, valeric acid, caproic acid and caprylic acid.

14. The method of claim 13, wherein the low temperature silicon nitride comprises HCD silicon nitride.

15. A method of etching a doped oxide material on a substrate, comprising:
    applying an etch solution comprising a 5-20:1:>0-3 (v/v/v) mixture of monocarboxylic organic acid:hydrofluoric acid:inorganic acid to a substrate comprising the doped oxide material and an exposed high temperature, chlorinated, inorganic silicon nitride material to etch the doped oxide material relative to the high temperature silicon nitride material at a selectivity of about 1000-1500:1, the organic acid having a dielectric constant of less than 3 and selected from the group consisting of butyric acid, isobutyric acid, valeric acid, caproic acid and caprylic acid.

16. The method of claim 15, wherein the high temperature silicon nitride comprises DCS silicon nitride.

17. A method of etching a doped oxide material on a substrate, comprising:
    applying an etch solution comprising an about 5-20:1:>0-3 (v/v/v) mixture of a monocarboxylic organic acid:hydrofluoric acid:inorganic acid to a substrate comprising the doped oxide material and an exposed silicon nitride material and polysilicon material to etch the doped oxide material selectively relative to the silicon nitride material and the polysilicon material at less than about 10 Å/minute, the organic acid having a dielectric constant of less than 3 and selected from the group consisting of butyric acid, isobutyric acid, valeric acid, caproic acid and caprylic acid.

18. The method of claim 17, wherein the inorganic acid is selected from the group consisting of nitric acid, sulfuric acid, hydrochloric acid, and phosphoric acid.

19. The method of claim 17, wherein the etch solution comprises an about 10:1:>0 to 1.5 (v/v/v) mixture of the organic acid:hydrofluoric acid:inorganic acid.

20. A method of forming a plurality of capacitor devices, comprising:
    forming openings extending into a doped oxide layer and an overlying silicon nitride layer;
    forming a conductive container structure comprising a conductive material layer within the openings, the conductive container structure having an opening extending therein, an outer surface along the doped oxide layer, and a laterally opposed inner surface within the opening;
    removing a portion of the silicon nitride layer to expose the doped oxide layer adjacent a segment of the outer surface of the conductive container structures, while retaining portions of the silicon nitride layer connecting adjacently positioned conductive container structures; and
    removing a portion of the doped oxide layer selectively relative to the silicon nitride and the conductive material layer to expose the segment of the outer surface of the conductive container structures by applying an etch solution comprising an about 5:1 to 20:1 (v/v) mixture of a monocarboxylic organic acid:hydrofluoric acid and an inorganic acid up to a volume of greater than zero to about 3, the organic acid having a dielectric constant of less than 3 and selected from the group consisting of butyric acid, isobutyric acid, valeric acid, caproic acid and caprylic acid.

21. The method of claim 20, wherein the silicon nitride comprises a low temperature, chlorinated, inorganic silicon nitride, and the etch solution etches the doped oxide material at an etch rate of about 20,000 Å/minute or greater, and relative to the low temperature silicon nitride material at a selectivity of about 250-400:1.

22. The method of claim 20, wherein the silicon nitride comprises a high temperature, chlorinated, inorganic silicon nitride, and the etch solution etches the doped oxide material at an etch rate of about 20,000 Å/minute or greater, and relative to the high temperature silicon nitride material at a selectivity of about 1000-1500:1.

23. The method of claim 20, wherein the doped oxide is selected from the group consisting of phosphosilicate glass, borophosphosilicate glass, and borosilicate glass.

24. The method of claim 20, wherein the conductive material layer comprises titanium nitride.

25. The method of claim 20, wherein the etch solution comprises the inorganic acid at a volume of greater than zero to up to about 1.5.

26. The method of claim 20, wherein the openings extend in an array comprising rows and columns, and the silicon nitride layer is patterned to extend between and connect pairs of the rows of the conductive structure array.

27. The method of claim 20, further comprising:
forming a capacitor dielectric layer over the exposed inner and outer surfaces of the conductive container structures; and
forming a second conductive material layer over the capacitor dielectric layer.

28. A method of forming a plurality of capacitor devices, comprising:
forming openings extending into a doped oxide layer and an overlying silicon nitride layer;
forming a conductive container structure comprising a conductive material layer within the openings, the conductive container structure having an opening extending therein, an outer surface along the doped oxide layer, and a laterally opposed inner surface within the opening;
forming a layer of polysilicon over the silicon nitride layer and the conductive material layer within the openings;
removing a portion of the polysilicon layer and the silicon nitride layer to expose the doped oxide layer adjacent a segment of the outer surface of the conductive container structures, while retaining portions of the silicon nitride layer connecting adjacently positioned conductive container structures; and
removing a portion of the doped oxide layer selectively relative to the polysilicon layer, the silicon nitride layer, and the conductive material layer to expose the segment of the outer surface of the conductive container structures by applying an etch solution comprising an about 5-20:1:>0-3 (v/v/v) mixture of a monocarboxylic organic acid:hydrofluoric acid:inorganic acid, the organic acid having a dielectric constant of less than 3 and selected from the group consisting of butyric acid, isobutyric acid, valeric acid, caproic acid and caprylic acid.

29. A method of forming a plurality of capacitor devices, comprising:
forming a layer of doped oxide extending over a memory cell array region, a peripheral region, and an intermediate region therebetween;
forming a layer of silicon nitride over the doped oxide layer;
forming openings extending into the doped oxide layer over the memory cell array region, and a trench extending into the doped oxide layer over the intermediate region;
forming a conductive layer within the openings and the trench, the conductive layer within the openings forming a conductive container structure having an opening extending therein, an outer sidewall along the doped oxide layer, and laterally opposed inner sidewall within the opening;
removing a portion of the silicon nitride layer to expose the doped oxide layer adjacent a segment of the outer surface of the conductive container structures, while retaining portions of the silicon nitride layer connecting adjacently positioned conductive container structures; and
removing a portion of the doped oxide layer selectively relative to the silicon nitride and the conductive material layer to expose the segment of the outer surface of the conductive container structures by applying an etch solution comprising an about 5-20:1:>0-3 (v/v/v) mixture of a monocarboxylic organic acid:hydrofluoric acid:inorganic acid, the organic acid having a dielectric constant of less than 3 and selected from the group consisting of butyric acid, isobutyric acid, valeric acid, caproic acid and caprylic acid.

30. A method of forming a plurality of capacitor devices, comprising:
applying an etch solution to a construction comprising a memory cell array region, a peripheral region, and an intermediate region therebetween, a doped oxide material overlying said regions, a plurality of electrically conductive container structures within the doped oxide material over the memory cell array region, the container structures comprising an opening extending therein, an outer sidewall along the doped oxide material, and laterally opposed inner sidewall within the opening, and a silicon nitride material overlying portions of the doped oxide material and interconnecting adjacently positioned conductive container structures, with other portions of the doped oxide material exposed adjacent a segment of the outer surface of the conductive container structures,
wherein the etch solution etches the doped oxide material selectively relative to the silicon nitride material to expose the outer surface of the conductive container structures, the etch solution comprising an about 5-20:1:>0-3 (v/v/v) mixture of a monocarboxylic organic acid:hydrofluoric acid:inorganic acid, the organic acid having a dielectric constant of less than 3 and selected from the group consisting of butyric acid, isobutyric acid, valeric acid, caproic acid and caprylic acid.

31. The method of claim 30, wherein the container structures comprise titanium nitride.

32. The method of claim 30, wherein the construction further comprises a layer of silicon overlying the silicon nitride layer.

33. The method of claim 30, wherein the construction further comprises a trench extending into the doped oxide layer over the intermediate region, the trench laterally surrounding the memory cell array, and an electrically conductive layer lining the trench.

34. The method of claim 33, wherein a layer of silicon overlies the conductive layer within the trench.

35. The method of claim 30, wherein the container structures extend in an array comprising rows and columns, and the silicon nitride layer extends between and interconnects pairs of the rows of the array.

36. The method of claim 30, wherein the etch solution has a pH of about 1 or less.

* * * * *

UNITED STATES PATENT AND TRADEMARK OFFICE
CERTIFICATE OF CORRECTION

PATENT NO. : 8,512,587 B2  
APPLICATION NO. : 11/830059  
DATED : August 20, 2013  
INVENTOR(S) : Niraj Rana et al.

Page 1 of 1

It is certified that error appears in the above-identified patent and that said Letters Patent is hereby corrected as shown below:

On Title Page, Item (56), under "Other Publications", column 2, line 2, delete "Electorchemical" and insert -- Electrochemical --, therefor.

In the Claims:
In column 11, line 44, in Claim 8, delete "electivity" and insert -- selectivity --, therefor.

In column 11, line 53, in Claim 11, delete "electivity" and insert -- selectivity --, therefor.

In column 11, line 58, in Claim 12, delete "electivity" and insert -- selectivity --, therefor.

Signed and Sealed this
Twelfth Day of November, 2013

Teresa Stanek Rea
*Deputy Director of the United States Patent and Trademark Office*